United States Patent
Kita

(10) Patent No.: US 8,063,976 B2
(45) Date of Patent: Nov. 22, 2011

(54) IMAGE PICK-UP APPARATUS AND METHOD OF CONTROLLING THE IMAGE PICK-UP APPARATUS

(75) Inventor: Kazunori Kita, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 657 days.

(21) Appl. No.: 12/177,389

(22) Filed: Jul. 22, 2008

(65) Prior Publication Data

US 2009/0027518 A1    Jan. 29, 2009

(30) Foreign Application Priority Data

Jul. 24, 2007  (JP) .................... 2007-191962
Nov. 9, 2007  (JP) .................... 2007-291432

(51) Int. Cl.
*H04N 5/225*  (2006.01)

(52) U.S. Cl. .................... 348/342; 348/231.6

(58) Field of Classification Search .................... 348/361
See application file for complete search history.

(56) References Cited

U.S. PATENT DOCUMENTS

| | | | | |
|---|---|---|---|---|
| 6,760,475 | B1* | 7/2004 | Miller | 382/162 |
| 2002/0071605 | A1* | 6/2002 | Iida et al. | 382/165 |
| 2004/0160614 | A1* | 8/2004 | Komiya et al. | 358/1.9 |
| 2005/0195304 | A1 | 9/2005 | Nitta et al. | |
| 2006/0044458 | A1* | 3/2006 | Kato et al. | 348/360 |
| 2006/0188150 | A1* | 8/2006 | Katsumata et al. | 382/162 |

FOREIGN PATENT DOCUMENTS

| | | | |
|---|---|---|---|
| JP | 02003990 A | * | 1/1990 |
| JP | 11-275412 A | | 10/1999 |
| JP | 2001-005046 A | | 1/2001 |

OTHER PUBLICATIONS

Y. Kanzaki et al; Relearning the Structure of a Digital Camera Systematically; pp. 142-144, Nikkei BP Softpress, May 24, 2004. (English language translation included).

* cited by examiner

*Primary Examiner* — Nhan T Tran
*Assistant Examiner* — Dennis Hogue
(74) *Attorney, Agent, or Firm* — Holtz, Holtz, Goodman & Chick, PC

(57) ABSTRACT

An image pick-up apparatus comprises a filter whose transmitting wavelength band is changed depending on an input drive signal, a spectral control unit for inputting the drive signal to the filter, thereby changing the transmitting wavelength band of the filter in plural steps, a single image pick-up unit disposed at rear side of the filter, for obtaining image data every time the transmitting wavelength band of the filter is changed, and a record control unit for recording plural pieces of image data obtained by the image pick-up unit.

20 Claims, 17 Drawing Sheets

IMAGE PICK-UP APPARATUS AND METHOD OF CONTROLLING THE IMAGE PICK-UP APPARATUS

FIELD OF THE INVENTION

The present invention relates to an image pick-up apparatus with a spectral shooting function and a method of controlling the image pick-up apparatus.

BACKGROUND OF THE INVENTION

Conventional cameras are separated into two types, cameras of a single plate type and cameras of separate plate type. The camera of a single plate type uses a single image pick-up element disposed in two dimensions, such as CCD and CMOS image sensor. The image pick-up element with RGB filter and/or CMY filter provided thereon is used to shoot a color picture. These RGB filter and CMY filter are Bayer arranged color filters.

The camera of separate plate type uses plural image pick-up elements. In this type of camera, a spectral device disposed behind an image pick-up lens, such as a beam splitter, is used to disperse light from an object, and the dispersed RGB lights fall on these image pick-up elements through color filters, whereby R, G, D data are generated and combined into a color image.

However, either in the camera of a single plate type or in the camera of a separate plate type, since transmitting wavelengths are determined by the color filter characteristics in shooting operation, it is hard in principle to obtain spectral images for respective wavelength bands.

Further, the camera of a separate plate type has disadvantages that plural image pick-up elements are used and alignment of these pick-up elements requires fine adjustment.

The present invention has been made to solve the disadvantages involved in the conventional apparatuses, and has an object to provide an image pick-up apparatus, which is compact in size and can obtain a spectral image of each spectral band.

SUMMARY OF THE INVENTION

According to one aspect of the invention, there is provided an image pick-up apparatus for shooting an object, which comprises a recording unit for recording data, a filter having a transmitting wavelength band for transmitting a light from the object, having the transmitting wavelength band, a spectral control unit for inputting a drive signal to the filter to change the transmitting wavelength band of the filter in plural steps, a single image pick-up unit disposed at a rear side of the filter, for generating image data every time when the transmitting wavelength band of the filter is changed by the spectral control unit, and a record control unit for recording in the recording unit plural pieces of image data generated by the single image pick-up unit.

According to other aspect of the invention, there is provided an image pick-up apparatus for shooting an object, which comprises a recording unit for recording data, a filter having a transmitting wavelength band for transmitting a light from the object, having the transmitting wavelength band, wherein the transmitting wavelength band is changed based on an input drive signal, a first selecting unit for selecting a transmitting wavelength band of the filter, a first spectral control unit for inputting a drive signal to the filter, thereby controlling the filter to allow the light from the object to pass through the filter having the transmitting wavelength band selected by the first selecting unit, a function performing unit for performing a process necessary for bringing a predetermined function of the image pick-up apparatus into practice, based on the light from the object which passes through the filter having the transmitting wavelength band under control of the first spectral control unit, a second selecting unit for selecting a transmitting wavelength band of the filter, a second spectral control unit for inputting the drive signal to the filter, thereby controlling the filter to allow the light from the object to pass through the filter having the transmitting wavelength band selected by the second selecting unit, and an image pick-up unit for shooting and recording in the recording unit an image of the object based on the light from the object passing through the filter having the transmitting wavelength band selected by the second selecting unit under control of the second spectral control unit.

According to another aspect of the invention, there is provided a method of controlling an image pick-up apparatus for shooting an object, the apparatus having a recording unit for recording data, a filter for transmitting a light from the object, having a transmitting wavelength band, wherein the transmitting wavelength band is changed based on an input drive signal, and a single image pick-up unit disposed at a rear side of the filter, for generating image data every time when the transmitting wavelength band of the filter is changed, which method comprises inputting the drive signal to the filter, thereby changing the transmitting wavelength band of the filter in plural steps, making the single image pick-up unit operate to generate image data every time when the transmitting wavelength band of the filter is changed, and recording in the recording unit plural pieces of image data generated by the single image pick-up unit.

According to still another aspect of the invention, there is provided a method of controlling an image pick-up apparatus for shooting an object, the apparatus having a recording unit for recording data and a filter having a transmitting wavelength band which is changed in accordance with an input drive signal, which method comprises a first selecting step of selecting a first transmitting wavelength band of the filter, a first controlling step of inputting the drive signal to the filter, thereby controlling the filter to allow a light from the object to pass through the filter having the first transmitting wavelength band selected at the first selecting step, a function performing step of performing a process necessary for bringing a predetermined function of the image pick-up apparatus into practice, based on the light from the object which passes through the filter having the first transmitting wavelength band under control at the first controlling step, a second selecting step of selecting a second transmitting wavelength band of the filter, a second controlling step of inputting the drive signal to the filter, thereby controlling the filter to allow the light from the object to pass through the filter having the second transmitting wavelength band selected at the second selecting step, and an image pick-up step of shooting and recording in the recording unit an image of the object based on the light from the object passing through the filter having the second transmitting wavelength band selected at the second selecting step under control at the second controlling step.

DETAILED DESCRIPTION OF THE PREFERRED EMBODIMENTS

Figure 1:
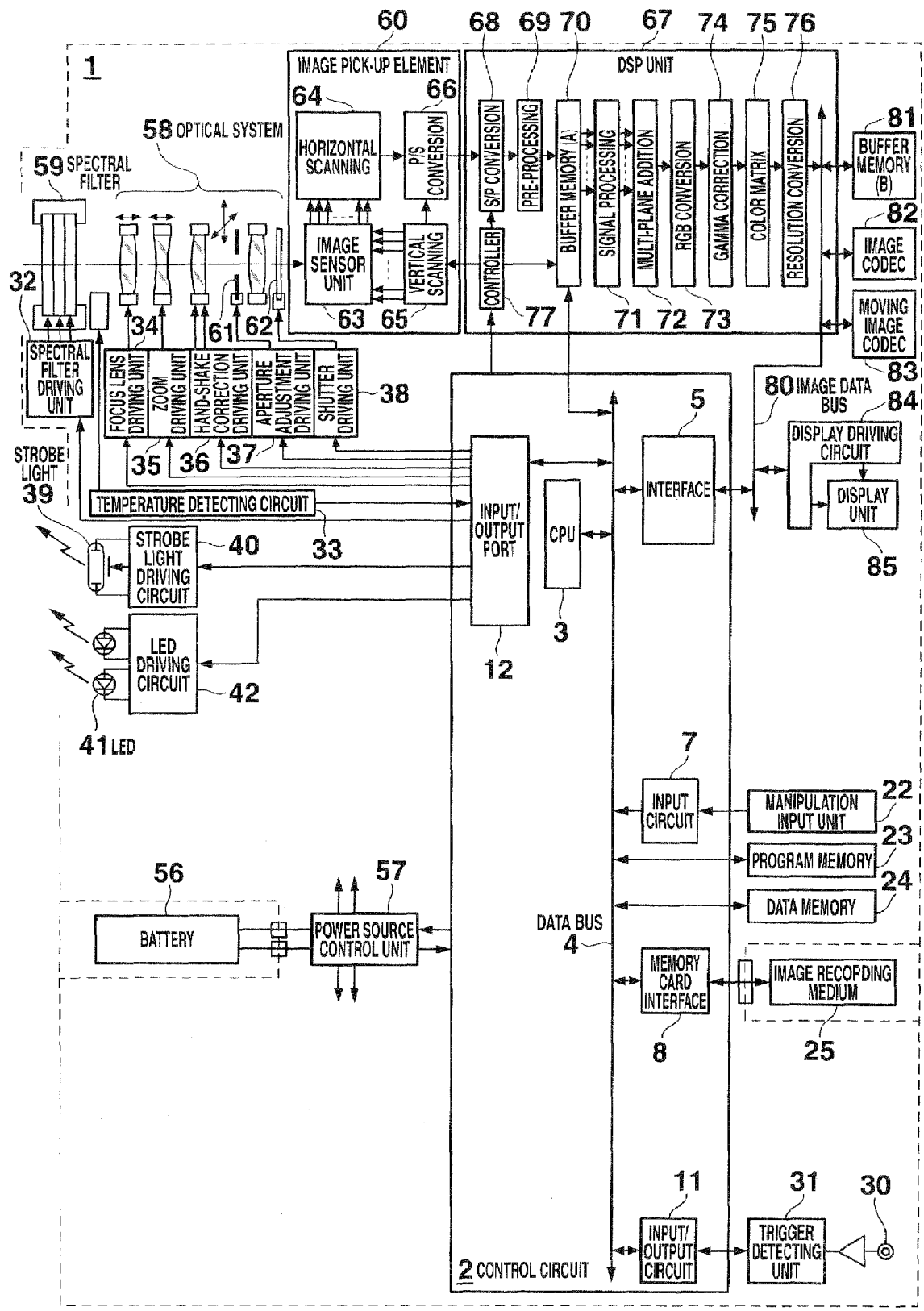
FIG. 1 is a block diagram of a circuit configuration of a digital camera according to the embodiments of the invention.

Now, embodiments of the present invention will be described in detail with reference to the accompanying drawings. FIG. 1 is a block diagram of a circuit configuration of a digital camera (spectral camera) 1 according to the embodiment of the present invention. As shown in FIG. 1, the digital camera 1 has a control circuit 2. The control circuit 2 includes CPU 3, and an interface 5, input circuit 7, memory card IF 8, input/output circuit 11, input/output ports 12, 13, wherein the interface 5, input circuit 7, memory card IF 8, input/output circuit 11, input/output port 12 are connected to CPU 3 through a data bus 4. The input circuit 7 is connected to a manipulation input unit 22 including various sorts of manipulation keys and switches. An image recording medium 25 is detachably connected to the memory card IF 8. An external trigger terminal 30 is connected to the input/output circuit 11 through a trigger detecting unit 31.

To the input/output port 12 are connected a spectral filter driving unit 32, temperature detecting circuit 33, focus lens driving unit 34, zoom driving unit 35, hand-shake correction driving unit 36, aperture adjustment driving unit 37 and shutter driving unit 38. A strobe light 39 is connected to the input/output port 12 through a strobe light driving circuit 40, and further LEDs 41, 41 are connected to the input/output port 12 through LED driving circuit 42. These LEDs 41, 41 serve to produce a subsidiary light in an auto-focusing operation and/or in a photographing operation, as in the similar manner by the strobe light 39. LED driving unit 42 can change a light color, light wavelength, and light wavelength band of a light produced by LED 41.

The temperature detecting circuit 33 detects a temperature in the vicinity of the spectral filter 59.

A battery 56 is connected to the control circuit 2 through a power source control unit 57. The power source control unit 57 supplies various parts in the digital camera 1 with electric power of the battery 56 adjusted by the control circuit 2. To the data bus 4 are program memory 23 and data memory 24. The program memory 23 stores a program for the control circuit 2 to work in accordance with a flow chart to be described later, and the data memory 24 previously stores various sorts of data and another data other than image data.

An optical system 58 for taking a picture consists of a lens group driven by the focus lens driving unit 34, zoom driving unit 35 and hand-shake correction driving unit 36. And an optical filter 59 is disposed on the optical axis of the lens group in the side (front side) facing an object to be photographed, and an image pick-up element 60 is disposed on the optical axis of the lens group in the rear side.

Nowadays, CMOS image sensors have been developed and in practical use, which are capable of taking pictures of a high resolution at a high frame rate, for example, pictures of a resolution of 6 million pixels at 60 frame rate/sec, and pictures of a low resolution of VGA at more than 300 frame rate/sec. In the embodiment of the digital camera 1, the image pick-up element 60 uses the image sensor, which has been developed and in practical use and is capable of taking pictures of a high resolution at a high frame rate. An aperture mechanism 61 driven by the aperture adjustment driving unit 37 and shutter mechanism 62 driven by the shutter driving unit 38 are provided between lenses of the lens group in the optical system 58 for taking pictures.

The image pick-up element 60 has a capability of a high speed reading such as a parallel reading for photographing at a high frame rate, but has no RGB color filter of Bayer arrangement, different from conventional image pick-up elements. The image pick-up element 60 is provided with an image sensor unit 63, horizontal scanning unit 64, vertical scanning unit 65, and P/S (Parallel to Serial) conversion unit 66. The horizontal scanning unit 64 includes a signal reading unit, signal processing unit, and CDS (Correlated Double Sampling Circuit)/ADC (A/D converter). The image pick-up element 60 is connected with DSP unit 67. DSP unit 67 is provided with S/P (Serial to Parallel) conversion unit 68, pre-processing unit 69, buffer memory (A) 70, signal processing unit 71 for processing signals in each wavelength band, multi-plane addition circuit 72, RGB conversion unit 73, gradation conversion gamma correction unit 74, color matrix circuit 75, and a resolution conversion unit 76, wherein S/P conversion unit 68 serves to process an image signal received from and P/S conversion unit 66 of the image pick-up element 60. Further, DSP unit 67 is provided with a controller 77 for adjusting a scanning period of the vertical scanning unit 65.

The resolution conversion unit 76 is connected to a buffer memory (B) 81, image CODEC (image coder decoder) 82, moving image CODEC (moving image coder decoder) 83, and a display driving circuit 84 through an image data bus 80, and the image data bus 80 is connected to the interface 5 of the control circuit 2. The buffer memory (B) 81 temporarily stores image data to be subjected to an encoding process and decoding process by the image CODEC 82 and moving image CODEC 83. The display driving circuit 84 drives a display unit 85 including LCD. The spectral filter 59 has narrow transmitting wavelength band characteristics in a near-ultraviolet light range, visible light range and near-infrared light range. As the spectral filter 59 having the narrow transmitting wavelength band characteristics, Lyot filter and Fabry-Perot interference filter are used, which will be described later. Further, an electronic control filter, such as LCTF (Liquid Crystal Tuner Filter) and LCFP (Liquid Crystal Fabry-Perot) etalon, can be used.

First Embodiment

Figure 2:
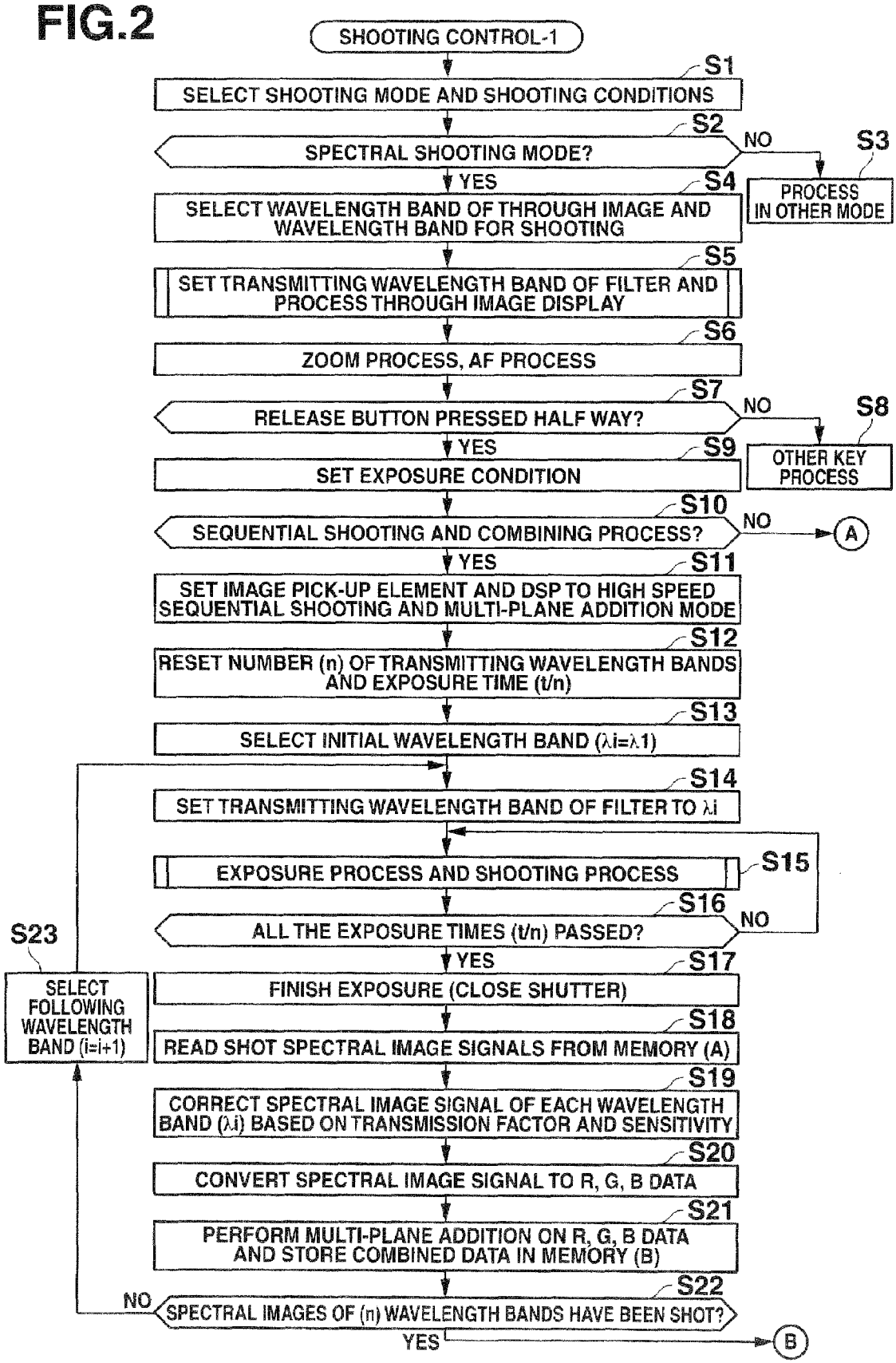
FIGS. 2 and 3 are flow charts of a shooting control process in the first embodiment of the invention.
Figure 3:
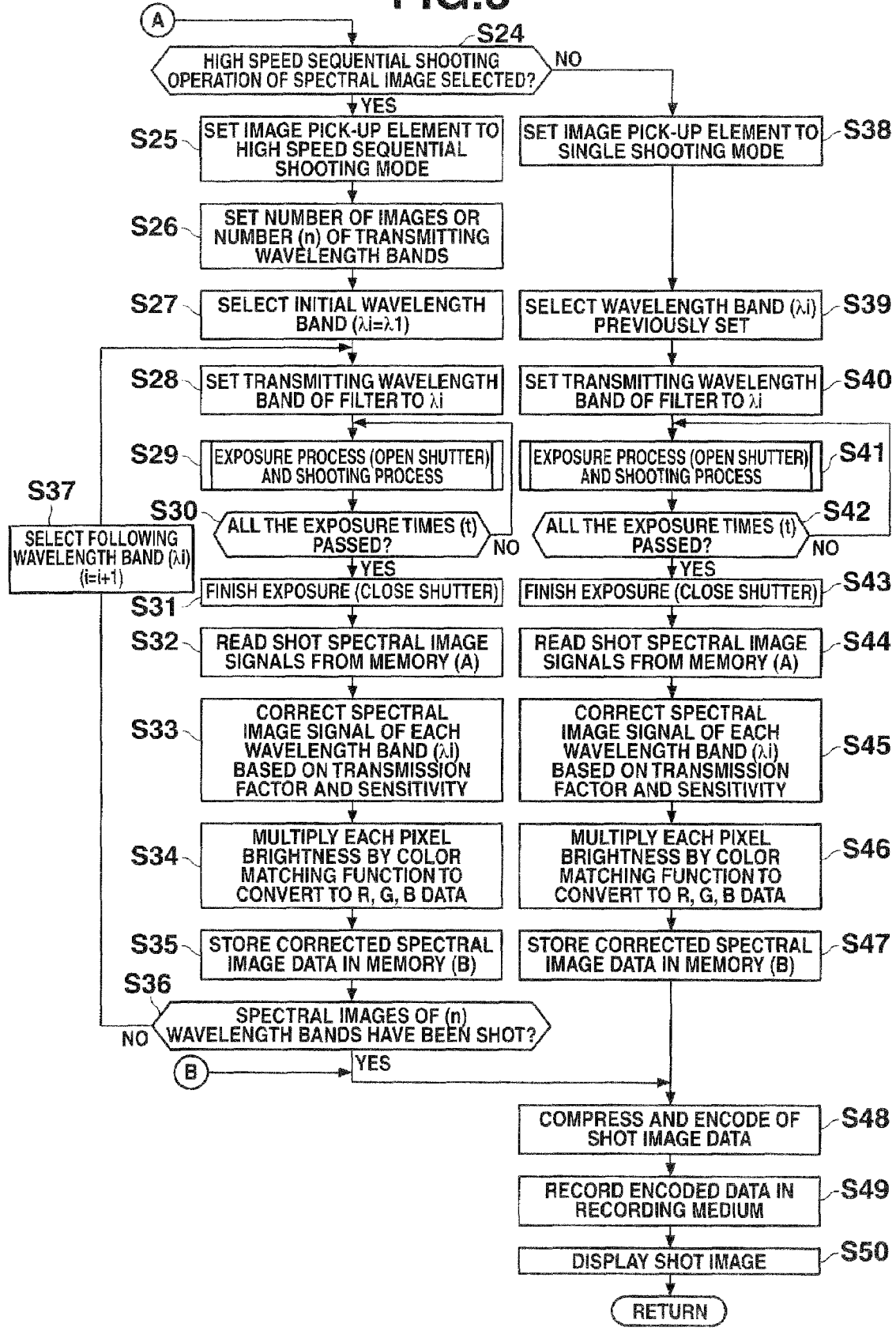

FIGS. 2 and 3 are flow charts of a shooting control process in the first embodiment of the invention. The digital camera 1 according to the first embodiment of the invention has plural shooting modes for obtaining spectral images, such as a "single shooting mode" (single spectral image shooting mode) for shooting a spectral image in a predetermined wavelength band, a "high speed sequential shooting mode" (high speed sequential spectral image shooting mode) for sequentially shooting plural spectral images over plural wavelength bands at a high speed with the wavelength bands being sequentially switched, and a "sequential shooting and combining mode" (sequential spectral image shooting and combining mode) for sequentially shooting plural spectral images over plural wavelength bands including all the wavelength bands of visible light at a high speed with the wavelength bands being sequentially switched and for applying multi-plane addition to the plural spectral images, thereby transforming the plural spectral images into a color image signal of a wide wavelength band, such as general RGB data and YUV data, and recording the color image signal. In the "sequential shooting and combining mode" for processing spectral images, variations in spectral image shooting characteristics including transmission factors of the filter and lens for each wavelength band and photographic sensitivity of the image pick-up element are corrected in shooting spectral images, and then the multi-plane addition and process for transforming to RGB data are subjected to the spectral images.

The control circuit 2 runs the program stored in the program memory 23 to perform processes in accordance with the flow charts of FIGS. 2 and 3. In response to manipulation of a user on the manipulation input unit 22, the control circuit 2 selects a shooting mode and shooting conditions at step S1 in FIG. 2. Then, it is judged at step S2 whether or not the selected shooting mode is a shooting mode for shooting a spectral image (spectral shooting mode). When it is determined that the spectral shooting mode has not been selected (NO at step S2), the control circuit 2 performs processes in other mode at step S3.

When it is determined that the spectral shooting mode has been selected (YES at step S2), the control circuit 2 selects a wavelength band of a monitor image (an image to be monitored on the display unit) and a shooting wavelength band in response to manipulation of a user on the manipulation input unit 22 at step S4. The wavelength band of a monitor image means a wavelength band of a through image to be displayed on the display unit 85, and the shooting wavelength band means a wavelength band of an image to be recorded when the "single spectral image shooting mode" (to be described later) is selected in the spectral shooting mode. And the shooting wavelength band is a wavelength band of an image used for AF (Automatic Focus control operation) and AE control operation (Automatic Exposure control operation).

The wavelength band of the monitor image and the shooting wavelength band are fixedly set to predetermined wavelength bands and may be selected from the wavelength bands fixedly set previously.

The control circuit 2 sets the electronic control filter (spectral filter 59) to the wavelength band of the monitor image selected at step S4, and performs a process to display the monitor image having the selected wavelength band on the display unit 85 at step S5. The process to be executed at step S5 will be described in detail with reference to a flow chart shown in FIG. 4.

Then, a zoom process and AF process are performed at step S6. In the process at step S6, AF process and AE process are performed on an object in a zoom frame 851 selected by the user's manipulation of the manipulation input unit 22. And since the spectral filter 59 is set at step S5 to the wavelength band selected at step S4, AF process and AE process are performed on an image having a wavelength band passing through the spectral filter 59.

Further, it is judged at step S7 whether or not a release button in the manipulation unit 22 has been pressed. When the release button has not been pressed. (NO at step S7), other key process is performed at step S8. When the release button has been pressed (YES at step S7), a light measurement process is performed at step S9, whereby an exposure condition (aperture and exposure time t) is set based on the light measuring value and the shooting condition selected at step S1.

Then, it is judged at step S10 whether or not the shooting condition selected at step S1 is for a sequential shooting and combining process for sequentially shooting spectral images to be combined. When the sequential shooting and combining process has not been selected (NO at step S10), the control circuit 2 advances to step S24 in FIG. 3. When the sequential shooting and combining process has been selected (YES at step S10), the control circuit 2 sets a high speed sequential shooting and multi-plane addition mode to the image pick-up element 60 and DSP unit 67 at step S11.

Depending on the shooting condition, the number (n) of transmitting wavelength bands and respective exposure times (t/n) are set again at step S12. In other words, with respect to one sheet of image, an exposure and shooting process is performed for each of (n) pieces of transmitting wavelength bands within the exposure time (t) set at step S9. Then, the exposure time for each transmitting wavelength band will be "t/n" and therefore the exposure time of "t/n" and the number of transmitting wavelength bands of "n" are set.

The first wavelength band ($\lambda i = \lambda 1$) is selected from the wavelength band of the image which is divided into (n) pieces of wavelength bands at step S13. The first wavelength band ($\lambda i = \lambda 1$) may be selected from a wavelength band at the shortest wavelength side or a wavelength band at the longest wavelength side. The control circuit 2 applies a predetermined driving signal to the electronic control filter (spectral filter 59) at step S14 to set the transmitting wavelength band of the filter to the wavelength band $\lambda 1$ selected at step S13. Further, the control circuit 2 performs the exposure (shutter open) and shooting process, wherein the control circuit 2 makes the shutter driving unit 38 operate to open the shutter 62 and stores image data from the image sensor unit 63 in the buffer memory (A) 70 at step S15. Therefore, spectral image data of the wavelength band $\lambda 1$ transmitting through the spectral filter 59 is stored in the buffer memory (A) 70 in the process at step S15.

Then, it is judged at step S16 whether or not all the exposure times "t/n" reset at step S12 have passed. When all the exposure times have passed (YES at step S16), the control circuit 2 makes the shutter driving unit 38 operate to close the shutter 62 at step S17. A loop of processes at steps S14 to S23 are repeatedly performed every exposure time "t/n", and the spectral image data shot and stored in the buffer memory (A) 70 at step S15 is read from the buffer memory (A) 70 at step S18.

The spectral image data read from the buffer memory (A) 70 is corrected with respect to each wavelength band ($\lambda i$) based on the transmission factor $F(\lambda i)$ of the spectral filter 32 and sensitivity $S(\lambda i)$ of the image pick-up element at step S19. A brightness value $V(x, y; \lambda i)$ of each pixel in the spectral image data is multiplied by a color matching function, whereby the spectral image data is converted into R, G, B data at step S20. And R, G, B data of each pixel of the spectral images photographed every wavelength band are subjected to multi-plane addition and combined, and then are stored in the buffer memory (B) 81 at step S21. As described above, R, G, B data of each pixel of the spectral images which have been shot every period of "t/n" are subjected to multi-plane addition and combined, whereby combined images are successively generated, and therefore, the image successively generated, that is, the updated image is successively stored in the buffer memory (B) 81. The processes at step S18 to step S21 will be described later in detail.

Then, it is judged at step S22 whether or not spectral images for (n) pieces of wavelength bands have been shot, that is, whether or not i☐n is true. When i☐n is not true, and images for (n) pieces of wavelength bands have not been shot(NO at step S22), a value of "i" is incremented (i=i+1), and a following wavelength band (λi) indicated by the value of "i" is selected at step S23. Then, the processes at steps S14 to S22 are performed again. Therefore, the processes at steps S14 to S22 are repeatedly performed (n) times at a timing of "t/n". When these processes have been repeatedly performed (n) times, it is determined that i☐n is true (YES at step S22). The control circuit 2 moves from step S22 to step S48 in FIG. 3. When the process at step S20 has been repeatedly performed (n) times, R, G, B data of each pixel in the spectral images having (n) pieces of wavelength bands are subjected to multi-plane addition and combined into a single combined image and the combine image is stored in the buffer memory (B) 81.

Meanwhile, when it is determined at step S10 in FIG. 2 that the sequential shooting and combining process is not selected (NO at step S10), the control circuit 2 advances from step 10 to step 24 in FIG. 3, where it is judged whether or not a high speed spectral image sequential shooting operation has been selected. When the high speed sequential spectral image shooting operation has not been selected (NO at step S24), the control circuit 2 advances to a process at step S38, as will be described later. When the high speed spectral image sequential shooting operation has been selected (YES at step S24), the control circuit 2 sets the image pick-up element 60 and DSP unit 67 to the high speed sequential shooting mode (no addition) at step S25.

The number (n) of spectral images to be sequentially shot at a high speed or the number (n) of transmitting wavelength bands are set in response to the user's manipulation on the manipulation input unit 22 at step S26. Then, the first wavelength band (λi=λ1) is selected, at step S27, from among the wavelength band of the image which is divided into (n) pieces of transmitting wavelength bands. The first wavelength band (λi=λ1) may be selected from a wavelength band at the shortest wavelength side or a wavelength band at the longest wavelength side. The control circuit 2 applies a predetermined driving signal to the electronic control filter (spectral filter 59) at step S28 to set the transmitting wavelength band of the filter to the wavelength band λ1 selected at step S27. Further, the control circuit 2 performs the exposure (shutter open) and shooting process, wherein the control circuit 2 makes the shutter driving unit 38 operate to open the shutter 62 and stores image data from the image sensor unit 63 in the buffer memory (A) 70 at step S29. Therefore, spectral image data having the wavelength band λ1 transmitting through the spectral filter 59 is stored in the buffer memory (A) 70 in the process at step S29.

Then, it is judged at step S30 whether or not an exposure times "t" has passed. When the exposure times has passed (YES at step S30), the control circuit 2 makes the shutter driving unit 38 operate to close the shutter 62 at step S31. A loop of processes at steps S28 to S37 are repeatedly performed every exposure time "t", and the spectral image data shot and stored in the buffer memory (A) 70 at step S29 is read from the buffer memory (A) 70 at step S32.

The spectral image data read from the buffer memory (A) 70 is corrected with respect to each wavelength band (λi) based on the transmission factor F(λi) and sensitivity S(λi) of the spectral filter 32 at step S33. A brightness value V (x, y; λi) of each pixel in the spectral image data is multiplied by a color matching function, whereby the spectral image data is converted into R, G, B data at step S34. The spectral images of respective wavelength bands thus corrected and converted are sequentially stored in the buffer memory (B) 81 at step S35. Therefore, the spectral images of respective wavelength bands photographed every period of "t/n" are sequentially stored in the buffer memory (B) 81. The processes at steps S32 to S35 will be described later in detail.

Then, it is judged at step S36 whether or not spectral images having (n) pieces of wavelength bands respectively have been shot, that is, whether or not i☐n is true. When i☐n is not true, and images having (n) pieces of wavelength bands have not been shot (NO at step S36), a value of "i" is incremented (i=i+1), and a following wavelength band (λi) indicated by the value of "i" is selected at step S37. Then, the processes at steps S28 to S36 are performed again. Therefore, the processes at steps S28 to S36 are repeatedly performed (n) times at a timing of "t". When these processes have been repeatedly performed (n) times, it is determined that i☐n is true (YES at step S36). The control circuit 2 moves from step S36 to step S48. When the process at step S34 has been repeatedly performed (n) times, the spectral images having (n) pieces of wavelength bands respectively are stored in the buffer memory (B) 81.

Meanwhile, when it is determined at step S24 that the high speed spectral image sequential shooting operation is not selected (NO at step S24), a single spectral image shooting operation is selected. In this case, the control circuit 2 advances from step S24 to step S38, where the control circuit 2 sets the image pick-up element 60 and DSP unit 67 to the single shooting mode (no addition) at step S38. The wavelength band (λi) set in response to the user's manipulation on the manipulation input unit 22 is selected at step S39. The control circuit 2 applies a predetermined driving signal to the electronic control filter (spectral filter 59) at step S40 to set the transmitting wavelength band of the filter to the wavelength band λ1 selected at step S39. Further, the control circuit 2 performs the exposure (shutter open) and shooting process, wherein the control circuit 2 makes the shutter driving unit 38 operate to open the shutter 62 and stores image data from the image sensor unit 63 in the buffer memory (A) 70 at step S41. Therefore, spectral image data having the wavelength band λ1 transmitting through the spectral filter 59 is stored in the buffer memory (A) 70 in the process at step S41.

Then, it is judged at step S42 whether or not an exposure times "t" set at step S9 has passed. When the exposure times has passed (YES at step S42), the control circuit 2 makes the shutter driving unit 38 operate to close the shutter 62 at step S43. The spectral image data shot and stored in the buffer memory (A) 70 at step S41 is read from the buffer memory (A) 70 at step S44. The spectral image data read from the buffer memory (A) 70 is corrected every wavelength band (λi) based on the transmission factor F(λi) and sensitivity S(λi) of the spectral filter 32 at step S45. A brightness value V (x, y; λi) of each pixel in the spectral image data is multiplied by a color matching function, whereby the spectral image data is converted into R, G, B data at step S46. The corrected and converted spectral images of respective wavelength bands are successively stored in the buffer memory (B) 81 at step S47. Therefore, a single spectral image of the wavelength band λ1 set by the user is stored in the buffer memory (B) 81.

At step S48 following step S22 in FIG. 2, step S36 or step S47 in FIG. 3, the shot image data stored in the buffer memory (B) 81 is subjected to a compression and encode process. The shot image data subjected to the compression and encode process is stored in the image recording medium 25 at step S49. The control circuit 2 displays on the display unit 85 for a preview purpose an image based on the shot image data stored in the image recording medium 25 at step S50.

Therefore, when the sequential spectral image shooting and combining mode is selected, R, G, B data of each pixel in the shot spectral images of respective wavelength bands are subjected to multi-plane addition and combined into a single image. The single image is stored in the image recording medium 25, and displayed on the display unit 85 for a preview purpose. And when the high speed sequential spectral image shooting mode is selected, plural spectral images ((n) sheets of spectral images) shot every wavelength bands are stored in the image recording medium 25 and these spectral images are displayed on the display unit 85 for a preview purpose. Further, when the single spectral image shooting mode is selected, a single spectral image having a wavelength band selected by the user is stored in the image recording medium 25 and the single image is displayed on the display unit 85 for a preview purpose. Therefore, a compact camera in size is provided, which can be used to shoot color pictures of a high resolution and can obtain spectral images of narrow wavelength bands.

In other words, (A) when the spectral shooting for a special wavelength band selected within the visible light range is executed to shoot a person with a background of a scenery in daylight, a spectral image of the selected wavelength band can be obtained and recorded. When the spectral shooting is executed with transmitting wavelengths sequentially switched, multiple spectral images are obtained and combined, whereby an image of a wide wavelength band can be recorded. Further, (B) when the spectral shooting of a special wavelength band selected within the range from near-ultraviolet light to day light range and further to near-infrared light is executed at night, a spectral image of the selected wavelength can be recorded. When the spectral shooting is executed with transmitting wavelengths sequentially switched, multiple spectral images are obtained and combined, whereby an image of a wide wavelength band can be recorded. (C) When the spectral shooting of a special wavelength band selected within the range from infrared light to near-infrared light is executed for an infrared light shooting, multiple spectral images of the infrared light to near-infrared light range are combined, whereby the spectral images are converted into a false color image, and the false color image is recorded.

Figure 4:
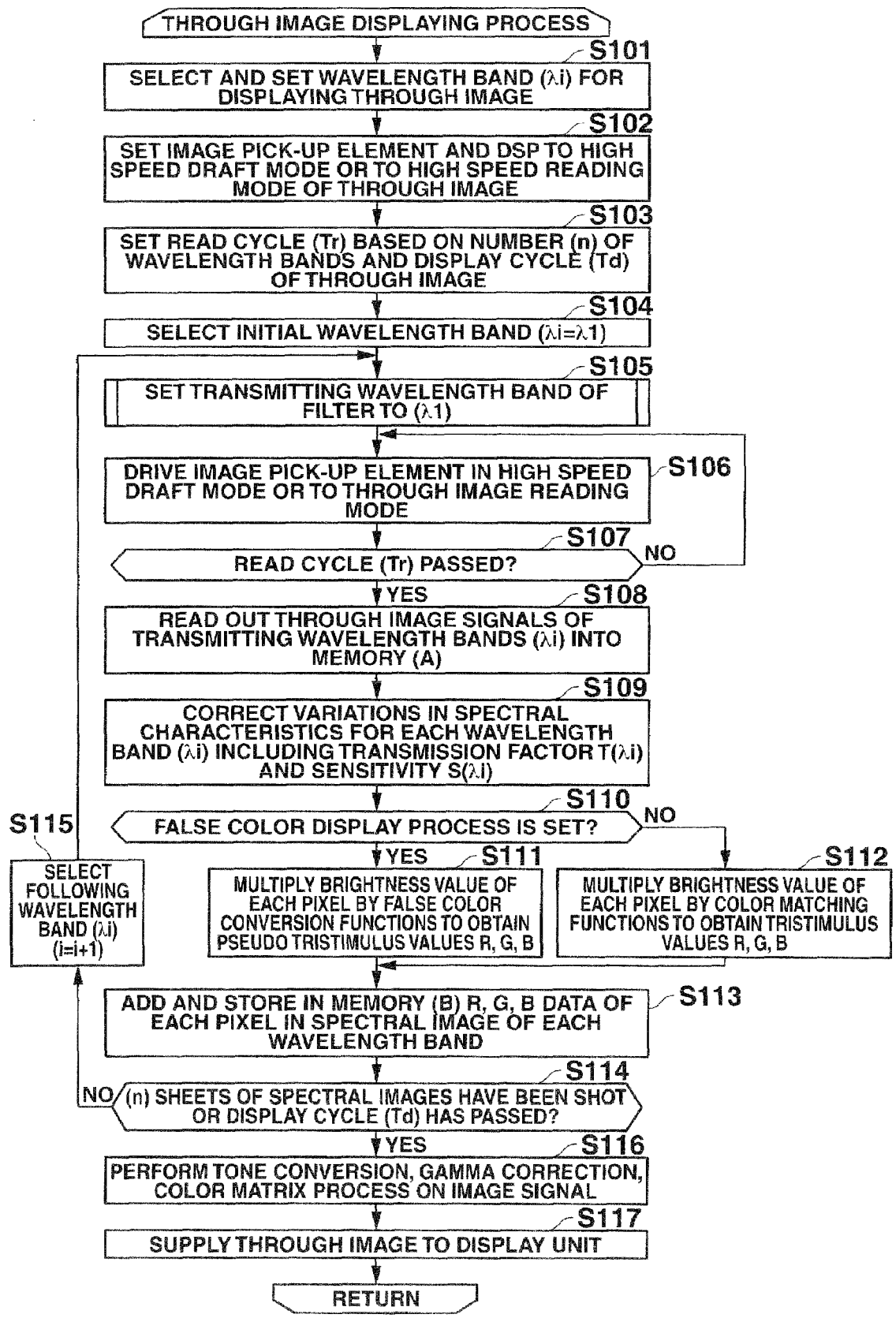
FIG. 4 is a flow chart of a display process for displaying a spectral through image in the first embodiment of the invention.

FIG. 4 is a flow chart of the displaying process for displaying the spectral through image in the present embodiment of the invention. The control circuit 2 runs the program stored in the program memory 23 to perform the displaying process in accordance with the flow chart of FIG. 4. The control circuit 2 selects and sets a wavelength band ($\lambda i$) of an image to be monitored (monitor image) in response to the user's manipulation on the manipulation input unit 22 at step S101. The monitor image may have a single wavelength band or plural wavelength bands. The control circuit 2 sets the image pick-up element 60 and DSP unit 67 to a high speed draft mode or to a high speed read mode for reading a through image (for a monitoring purpose) at step 102. Further, the control circuit 2 sets a reading cycle (Tr) based on the number (n) of wavelength bands of a through image, a display cycle (Td) of displaying the through image at step S103. The read cycle (Tr) meets the expression as follows: Tr□Td×(1/n). Then, the first wavelength band ($\lambda i = \lambda 1$) is selected, at step S104, from among (n) pieces of transmitting wavelength bands into which the wavelength band of the image is divided. The first wavelength band ($\lambda i = \lambda 1$) may be selected from a wavelength band at the shortest wavelength side or a wavelength band at the longest wavelength side.

The control circuit 2 applies a predetermined driving signal to the electronic control filter (spectral filter 59) at step S28 to set the transmitting wavelength band of the filter to the wavelength band $\lambda 1$ selected at step S105. Further, the control circuit 2 drives the image pick-up element 60 in the high speed draft mode or in the high speed read mode for reading a monitor image at step S106. Then, it is judged at step S107 whether or not the read cycle (Tr) set at step S103 has passed. When the read cycle (Tr) has passed (YES at step S107), the control circuit 2 advances to step S108. Therefore, a loop of processes at step A105 to step S005 are repeatedly performed every read cycle (Tr). And at step SS108 following step S107, a monitor image signal (x, y; $\lambda i$) of a transmitting wave length band ($\lambda i$) is read out in the buffer memory (A) 70 at step S108.

Further, variations in spectral characteristics such as a transmission factor T($\lambda i$) of the lens and the filter and sensitivity S($\lambda i$) of the image pick-up element are corrected with respect to each wavelength band ($\lambda i$) at step S109. The correction is made based on the following equation: V(x, y; $\lambda i$)=V(x, y; $\lambda i$)×{T0($\lambda i$)/T($\lambda i$)}×{S0($\lambda i$)/S($\lambda i$)} or V(x, y; $\lambda i$)=V(x, y; $\lambda i$)×{1/T($\lambda i$)}×{1/S($\lambda i$)}, where V(x, y; $\lambda i$) denotes a brightness signal, T($\lambda i$) denotes a spectral transmission factor of an image pick-up lens and/or interference filter for each wavelength band, S($\lambda i$) denotes the sensitivity of the image pick-up element, T0($\lambda i$) denotes the ideal spectral characteristics (100%) or the standard spectral transmission factor, and S0($\lambda i$) denotes the ideal spectral sensitivity or the standard spectral sensitivity.

Then, it is judged at step S110 whether or not a false color display process has been set. When the false color display process has been set (YES at step S110), a brightness value V(x, y; $\lambda i$) of each pixel is multiplied with false color converting functions r'($\lambda i$), g'($\lambda i$), b'($\lambda i$) at step S111, whereby pseudo tristimulus values R, G, B are obtained as shown by the following equations: Ri(x, y)=r'($\lambda i$)·V(x, y; $\lambda i$), Gi(x, y)=g'($\lambda i$)·V(x, y; $\lambda i$), and Bi(x, y)=b'($\lambda i$)·V(x, y; $\lambda i$).

When the false color display process is not set and a real color display process has been set (NO at step S110), the brightness value V(x, y; $\lambda i$) of each pixel is multiplied with color matching functions r($\lambda i$), g($\lambda i$), b($\lambda i$) at step S112, whereby tristimulus values R, G, B are obtained as shown by the following equations: Ri(x, y)=r($\lambda i$)·V(x, y; $\lambda i$), Gi(x, y)=g($\lambda i$)·V(x, y; $\lambda i$), and Bi(x, y)=b($\lambda i$)·V(x, y; $\lambda i$).

At step S113 following the steps S111 and S112, R, G, B data of each pixel in the spectral images of each wavelength are sequentially added as shown by the following equations and stored in the buffer memory (B) 81: R(x, y)=$\Sigma$iRi(x, y), G(x, y)=$\Sigma$iGi(x, y), and B(x, y)=$\Sigma$iBi(x, y). Therefore, R, G, B data of each pixel in the spectral image are sequentially added every read cycle (Tr), and updated R, G, B data are stored in the buffer memory (B) 81.

In the multi-plane addition for a conventional tricolor image pick-up element which is provided with mosaic-like RGB color filter, correlation of G (green) images, which are more sensitive to brightness elements and finely-resolved elements in data of Bayer arrangement of images shot sequentially is obtained for an alignment purpose, and an interpolation process is performed on the data of Bayer arrangement to interpolate pixels lacking in the data of Bayer arrangement and aligned vertically, horizontally or obliquely, thereby generating G (green) data of full pixels. R (red) and B (blue) data are subjected to an alignment and interpolation process based on the alignment of G (green) data, whereby the R, G, B data of the sequentially shot images are converted into R, G, B data of a full size. On the contrary in the digital camera 1 according to the embodiment of the present invention, the multi-plane addition circuit 72 corrects spectral images V sequentially shot every wavelength bands in variations of the spectral characteristics, and applies multi-plane addition to the compensated spectral images V over all the wavelength bands, combining them, thereby converting them into general color image data of a wide wavelength band such as R, G, B data or YUV data.

Then, it is judged at step S114 whether or not spectral images have been shot with respect to the selected wavelength bands, that is, whether or not i☐n is true and the number "i" of shot images has reached the number "n" of the selected wavelength bands, or it is judged whether or not the previously set display cycle (Td) has passed. When i☐n is not true and the display cycle (Td) has not passed (NO at step S114), a value of "i" is incremented by "1" (i=i+1), and the following wavelength band ($\lambda i$) is selected at step S115, and then the processes at steps S105 to S114 are repeatedly performed. Therefore, when a single wavelength band is selected, the processes at steps S105 to S114 are performed once. When the plural number (n) of wavelength bands are selected, the processes at steps S105 to S114 are performed (n) times.

When i☐n is true and the display cycle (Td) has passed (YES at step S114), the monitor image signal which is converted to R, G, B data is subjected to a signal process including a tone conversion, gamma correction, and color matrix process at step S116. Further, after the monitor signal thus processed is supplied to the display unit 85 at step S117, the processes above are repeatedly performed.

Therefore, when a range including a narrow wavelength band(s) or a range including not only a visible light range (wavelength from about 400 nm to 700 nm) but a near-infrared light range (wavelength from about 700 nm to 2500 nm), and a near-ultraviolet light range (wavelength from about 200 nm to 400 nm) is selected by user's manipulation, a continuous image of spectral images of the selected range is displayed on the display unit 85, while the monitor image is being displayed. When a range other than the visible light range, such as the near-infrared light range or near-ultraviolet light range is selected, an image signal including elements in the selected range is shifted to a visible light range or is converted to desired color data by changing RGB conversion expression, thereby displaying false color data, which allows the user to visibly confirm an object or composition of a picture to be shot in a dark place.

By selecting a desired wavelength band for the user to visibly observe an object to be shot, the user can shoot a scene which is hard to see in the visible light or at night in a normal way or to obtain a spectral image, while watching the object or the scene. Therefore, the user can follow the object without failure to shoot the same.

That is, (A) when a scene and a person are shot to obtain a through image with transmitting wavelength bands successively switched in the visible light range, multiple spectral images of the selected wavelength band are combined, whereby a real color (or false color) monitor image is displayed on the display unit 85. (B) When a scene is shot at night to obtain a through image with transmitting wavelength bands successively switched in the range from the near-ultraviolet light range to visible light range and further to near-infrared light range, multiple spectral images of the selected wavelength bands (including near-infrared light range) are combined, whereby a real color (or false color) monitor image is displayed on the display unit 85. (C) When an infrared shooting is performed to obtain a through image with the transmitting wavelength bands successively switched in the red light to near-infrared light region, multiple spectral images of the red to near-infrared light region are combined, whereby the wavelength range of the combined image is shifted and a desired false color monitor image is displayed on the display unit 85.

Since a male garden white and female garden white seem like in color to the human eye or in a visible light image, it is hard to tell which is which. But since the male garden white absorbs long wavelength ultraviolet light and seems black in an ultraviolet image, it is easy to tell the male garden white from female garden white of a light color. When the garden whites are shot to obtain a through image with transmitting wavelength bands successively switched in the range from the near-ultraviolet light range through visible light range to near-infrared light range, a monitor image of the garden whites is displayed such that the user can tell which is which. In the same manner, flowers such as a sunflower, oenothera, field mustard are hard to discriminate them with human eye or in a visible light image, but the base of a ligulate flower seems dark compared with its outside portion in an ultraviolet image. The anther and stigma of the ligulate flower seem like in visible wavelengths, but in the ultraviolet image the anther seems darker than the stigma. As described, they seem in a different manner in a specialty image. A specialty image, which gives actual feeling of how bees or other creatures see flowering grasses can be shot with the digital camera 1 of the present embodiment.

Now, configuration, operation and effects of the digital camera 1 according to the present embodiment of the invention will be described in detail.

[Spectral Filter 59] A filter having a transmitting wavelength characteristic of a narrow band is used as the spectral filter 59. Lyot filter, Fabry-Perot interference filter are available as the filter having the transmitting wavelength characteristic of a narrow band. Further, electronic control filters such as LCTF (Liquid Crystal Tunable Filter) and LCFP (Liquid Crystal Fabry-Perot) etaron may be used.

Figure 5:
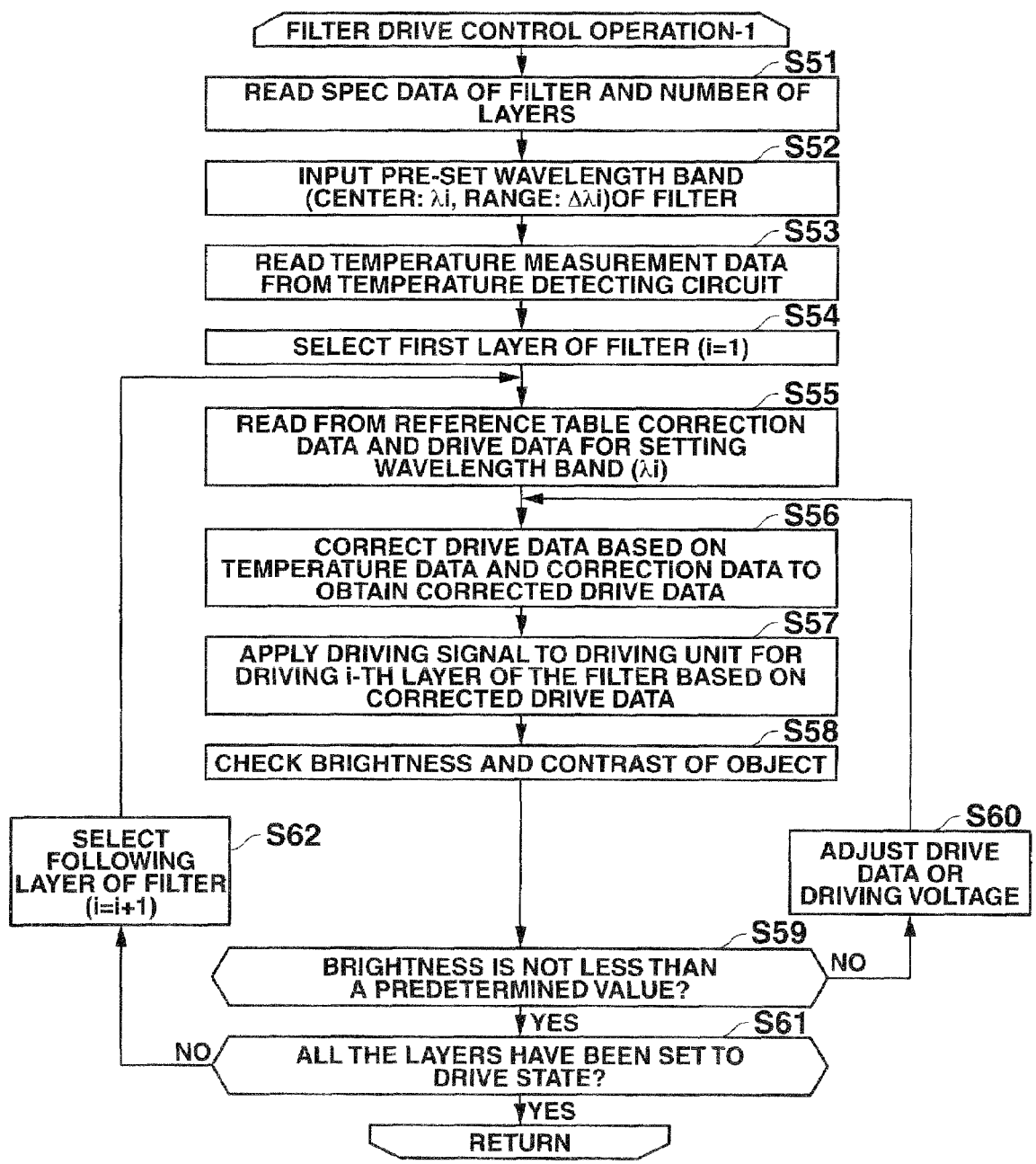
FIG. 5 is a flow chart of a control process (sample 1) for controlling the spectral filter.

FIG. 5 is a flow chart of a control operation (sample 1) for controlling the spectral filter 59, which is performed at steps S14, S28 and S40 in FIGS. 2 and 3. Specification data and the number (m) of layers of the spectral filter 59 are read from the program memory 23 at step S51. Setting wavelength band (center: $\lambda i$, range: $\Delta\lambda i$) of the filter is entered in response to user's manipulation on the manipulation input unit 22 at step S52. A detected signal is input from the temperature detecting circuit 33 to read temperature measurement data in the vicinity of the spectral filter 59 at step S53.

A value of "i" is set to "1" ("i=1") and the first layer of the spectral filter 59 indicated by "1" is selected at step S54. Drive data (such as LC (Liquid Crystal) driving voltage) for setting to the wavelength band $\lambda i$ of the first layer filter and correction data of correcting variations are read from a filter driving LUT (reference table) previously stored in the program memory at step S55. The drive data (drive data for setting to the wavelength band $\lambda i$ of the first layer filter) read at step S55 is corrected at step S56, based on the temperature measurement data read at step S53 and the correction data of correcting variations read at step S55, whereby correction driving data is obtained.

At step S57, a driving signal such as the driving voltage is applied to a driving unit for driving the first layer filter based on the drive data corrected at step S56, whereby brightness of an object or contrast (or transmitting characteristic of the filter) is checked at step S58. It is judged based on the result of check at step S59 whether or not the brightness of the object (or contrast, transmitting factor) is not less than a predetermined value. When the brightness of the object (or contrast, transmitting factor) is less than the predetermined value (NO at step S59), the drive data or driving voltage is adjusted at step S60, and the processes at steps S56 to S60 are repeatedly performed.

A loop of processes at steps S56 to S60 are repeatedly performed. and then the brightness of the object reaches not less than the predetermined value (YES at step S59). Then, the control circuit 2 advances from step S59 to step S61, where it is judged whether or not all the layer of filters have been set to the drive state, that is, it is judged whether or not i□m is true. When i□m is not true and all the layer of filters have not been set to the drive state (NO at step S61), a value of "i" is incremented (i=i+1) at step S62, and the processes at steps S55 to S61 are repeatedly performed.

Figure 6:
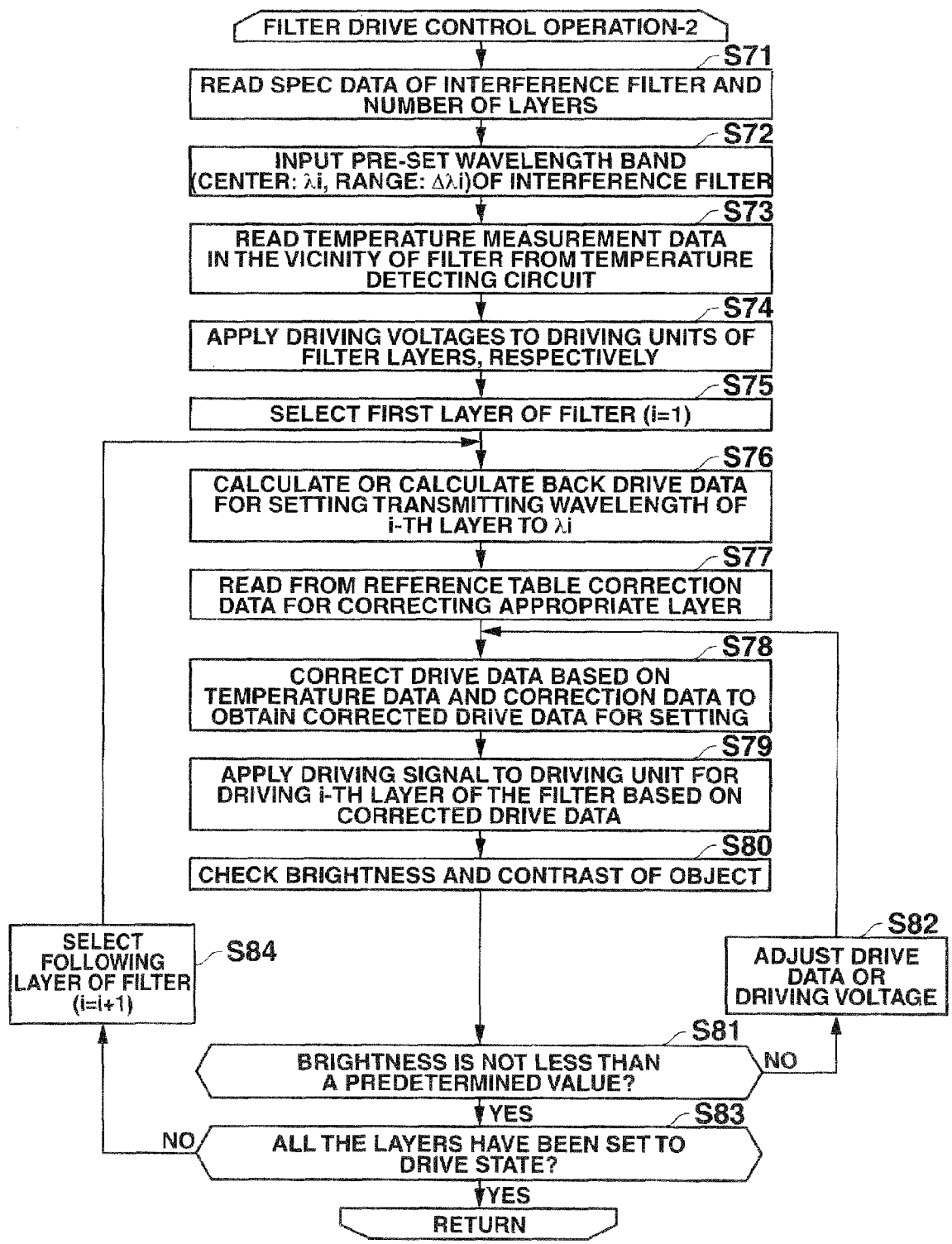
FIG. 6 is a flow chart of a control process (sample 2) for controlling the spectral filter.

FIG. 6 is a flow chart of a control operation (sample 2) for controlling the spectral filter 59, which is performed at steps S14, S28 and S40 in FIGS. 2 and 3. Specification data and the number (m) of layers of the interference filter (spectral filter 59) are read from the program memory 23 at step S71. Setting wavelength band (center: λi, range: Δλi) of the filter is entered in response to user's manipulation on the manipulation input unit 22 at step S72. A detected signal is input from the temperature detecting circuit 33 to read temperature measurement data in the vicinity of the spectral filter 59 at step S73.

Further, driving voltages are applied to driving units for driving the layers of the filter respectively, thereby resetting the filter to a predetermined initial position (initial spectral characteristic) at step S74. The control circuit 2 sets a value of "i" to "1" (i=1) and selects the first layer of the spectral filter 59 at step S74. Using a spectral characteristic calculating formula as will be shown later by way of example, drive data (such as a driving voltage for driving LC and/or actuator) is calculated or calculated back to set the transmitting wavelength of the (i)th layer of the filter to (λ) at step S76.

(Example) A refraction index (N) or LC driving voltage (V) is obtained, which realizes a phase difference (δ) at which the transmission factor T(λ) reaches the peak or will be not more than a predetermined value. In the case of Lyot filter, T(λ)=(cos 2ε)/2, where (δ)=(2π/λ)(Ne−No)d. In the case of Fabry-Perot filter, T(λ)=(1−R)2/{(1−R)2+4R sin 2(δ)}, where δ=4πnd cos θ/λ.

Then, correction data for correcting an appropriate layer of the filter is read from LUT (reference table) previously stored in the program memory 23 at step S77. The drive data calculated at step S76 is corrected based on the temperature measurement data read at step S73 and the correction data read 23 at step S77, thereby obtaining correction driving data at step S78. The driving signal (driving voltage) is applied to a driving unit of the (i)th layer filter based on the corrected drive data (correction driving data) at step S79, whereby brightness of an object or contrast (or transmitting characteristic of the filter) is checked at step S80. It is judged based on the result of check at step S81 whether or not the brightness of the object (or contrast, transmitting factor) is not less than a predetermined value. When the brightness of the object (or contrast, transmitting factor) is less than the predetermined value (NO at step S81), the drive data or driving voltage is adjusted at step S82, and the processes at steps S78 to S82 are repeatedly performed.

A loop of processes at steps S78 to S82 are repeatedly performed, and then the brightness of the object reaches a value of not less than the predetermined value (YES at step S81). Then, the control circuit 2 advances from step S81 to step S83, where it is judged whether or not all the layer of filters have been set to the drive state, that is, it is judged whether or not i□m is true. When i□m is not true and all the layer of filters have not been set to the drive state (NO at step S83), a value of "i" is incremented (i=i+1) at step S84, and the processes at steps S76 to S83 are repeatedly performed.

[Image Pick-up Element 60] In the case where the image pick-up element 60 uses CCD as in conventional apparatuses, signal charge which is generated in a photo diode in response to the incident light is transferred through vertical and horizontal passes in sequence and amplified by FD (Floating Diffusion) amplifier in an output circuit to a signal voltage. An image pick-up signal output from CCD is subjected to a noise reduction/sample hold process in CDS (Correlated Double Sampling) circuit and amplified by AGC (Automatic Gain Control) amplifier. The amplified signal is converted into a digital image signal by ADC (Analog/Digital converter), and further supplied to DSP (signal processing circuit).

Meanwhile, the case where the image pick-up element 60 uses CMOS image sensor will be described. In CMOS sensor of a general APS (Active Pixel Sensor) type, each unit pixel circuit including a photo diode has a built-in amplifying element and a signal charge is subjected to a photoelectric conversion in the photo diode and amplified by the built-in amplifier in the pixel circuit. Image signals are successively output as a current or voltage from pixels, wherein each pixel is chosen in XY address system in accordance with a column address choosing signal from a vertical scanning circuit and a row address choosing signal from a horizontal scanning circuit. In CCD, the image signals are sequentially output in order, but in CMOS sensor, the image signals can be taken out from arbitrary pixels or from pixels in arbitrary area in an arbitrary order. Therefore, the image signals can be taken out only from pixels in a predetermined area at a high speed in the digital zooming process. Since the signal charge is transferred without being subjected to any process in CCD, smear or noises are easily caused in the image signal. But in CMOS sensor, each pixel can be accessed at random, and each pixel circuit is electrically separated from each other, and therefore the image signal is hard to receive transmission noises. Further, CMOS sensor has advantages that an integrated circuit can be easily produced in a manufacturing process, in which circuit CMOS sensor, a logic circuit such as an adding circuit and a signal processing circuit are integrated in a high density.

(1) High Speed Image Sensor

In the image sensor unit 63 of the digital camera 1 according to the embodiment of the invention, an image area of an arbitrary size is selected, and image signals from the pixels within the selected image area are read. Further, an adding circuit is provided in a subsequent stage of CDS/ADC circuit in a column circuit of CMOS sensor or provided in a horizontal output circuit, wherein image signals from plural pixels which are adjacent to each other and have the same color filter are added in a digital manner. In a digital zooming operation or a high sensitivity shooting operation, pixel data in the selected image area is added with respect to plural pixels in every arbitrary column to generate an image signal, whereby a shooting sensitivity per pixel is substantially enhanced by the number of added pixel data, allowing shooting at a short exposure time to obtain a picture of a good exposure condition.

In a moving image shooting operation at a high speed rate or in a sequential shooting operation, pixel data is converted to an image signal of a small volume of image data. Column signals selected from CDS/ADC circuit in the column circuit by a column choosing signal from the horizontal scanning circuit are output sequentially, but at this time the image signal read selectively from pixels in the selected area or pixel data added signal is output as parallel digital signals in synchronism with a high speed clock signal, or is converted into a serial digital image signal by a parallel/serial conversion circuit and the serial digital image signal is transferred to DSP at a high speed rate through a transmission circuit of LVDS (Low Voltage Differential Signaling).

(2) CDS/ADC Circuit and Adding Circuit

Unexamined Japanese Patent Publication No. 2005-278135 discloses that ADC circuit is constructed as CDS/ADC circuit using a parallel connection of ADC comparator and an up/down counter, and a digital value is written into a memory unit, and for example CMOS image sensor performs a pixel addition operation with no counter for continuously counting following pixel value without resetting a counter. Therefore, the above CMOS image sensor may be used as the image sensor unit 63 of the present embodiment.

Figure 7:
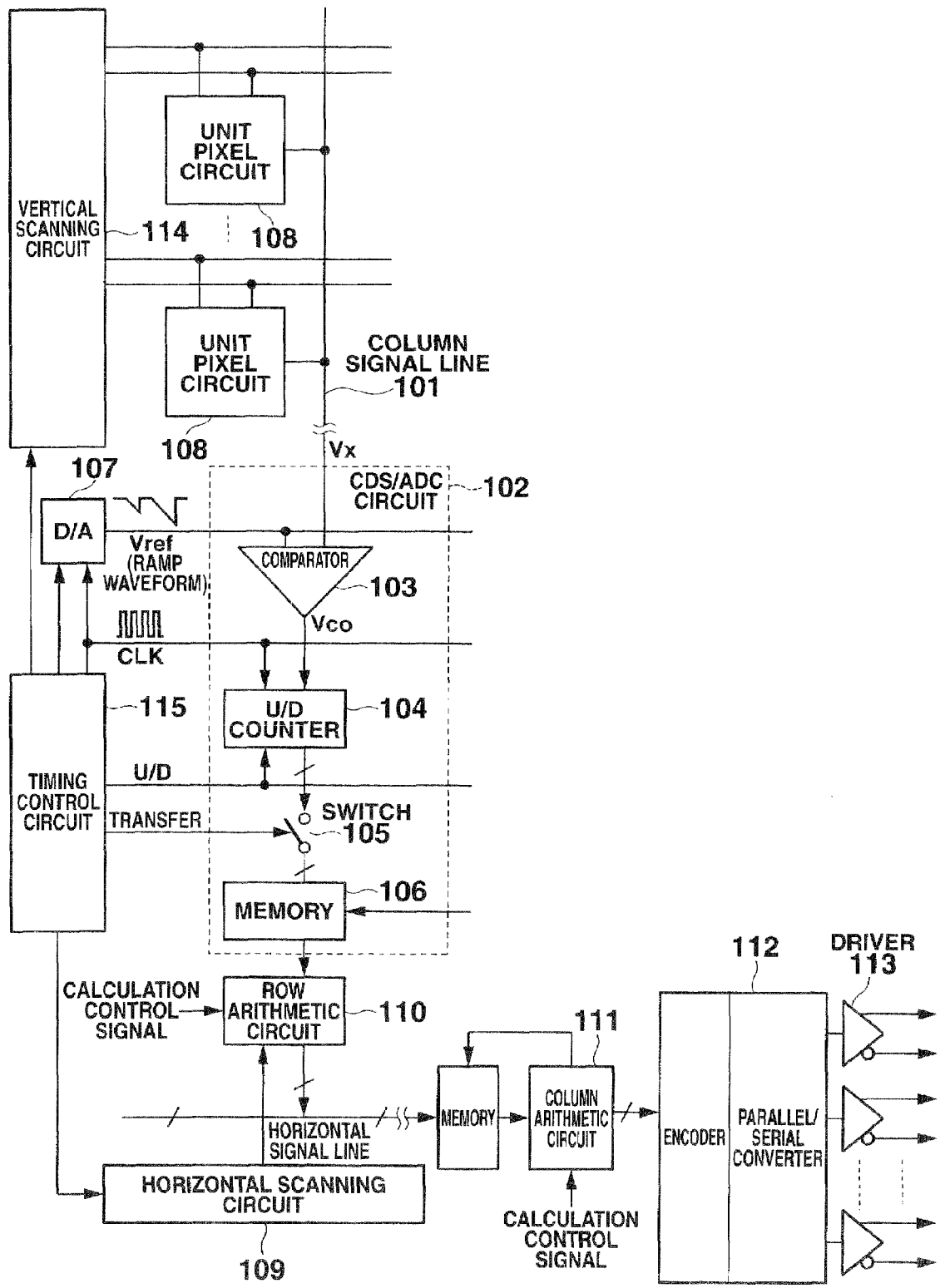
FIG. 7 is a view showing a circuit configuration of a column arithmetic circuit and pixel adding circuit.
Figure 8:
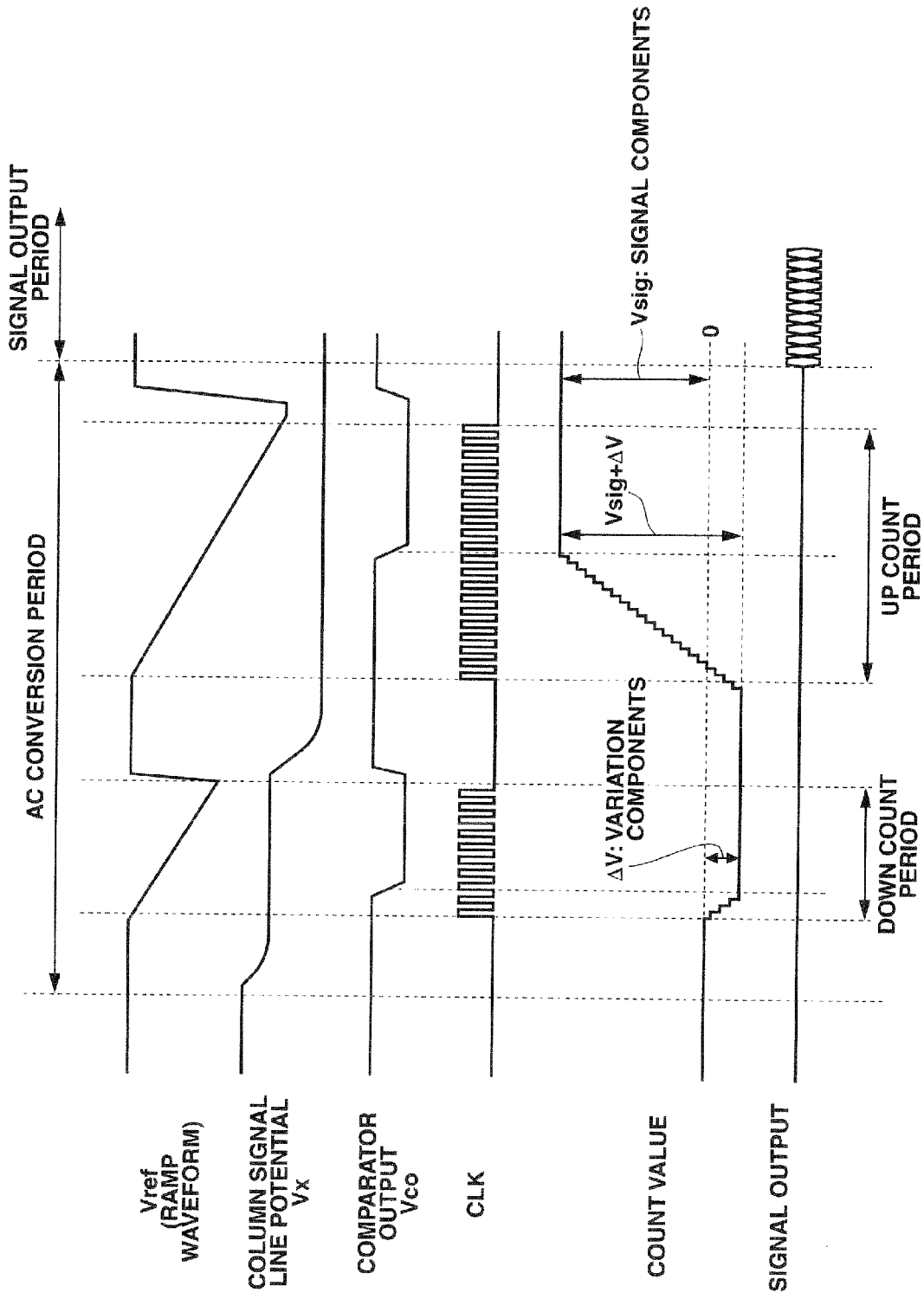
FIG. 8 is a timing chart of operation of the column arithmetic circuit and pixel adding circuit.

FIG. 7 is a view showing a circuit configuration, in which CDS/ADC circuit disclosed in the above unexamined Japanese Patent Publication No. 2005-278135 is provided with a row arithmetic circuit 110 and column arithmetic circuit 111 for performing arbitrary calculations other than pixel adding computation, and a parallel digital/serial digital converter circuit 112 and LVDS driver 113 are provided on an output line. FIG. 8 is a timing chart of operation of CDS/ADC circuit.

A column circuit unit has CDS/ADC circuits 102, which are connected to column lines 101, respectively. The column circuit converts an analog signal into a digital signal and outputs the digital signal, wherein the analog signal of each column is output from each unit pixel circuit 108 connected to a vertical scanning circuit 114. ADC circuit (Analog/Digital converter circuit) of each column is set to a normal frame rate mode (no addition) and/or a high speed frame rate mode (vertical addition) based on a control signal, and its operation can be switched to perform A/D conversion operation corresponding to the normal frame rate mode or A/D conversion operation corresponding to the high speed frame rate mode, wherein the normal frame rate mode is prepared for a progressive scanning system to read an image signal of the whole wavelength range, and the high speed frame rate mode is for setting an exposure time of each pixel to 1/N to increase the frame rate by N times, for example, twice. Each ADC circuit comprises a comparator 103, U/D (up/down) counter 104, transmission switch 105 and memory 106.

A reference voltage generating unit includes, for example, DAC (Digital/Analog converter) 107, and generates a reference voltage Vref having a RAMP waveform based on the a clock signal CLK from a timing control unit 115, wherein the reference voltage Vref changes its level to slant downward as a time passes. The comparator 103 compares a signal voltage Vx of n-th column signal line with the reference voltage Vref of a RAMP waveform from the reference voltage generating unit. For example, when the reference voltage Vref is larger than the signal voltage Vx of the column signal line 101, the comparator 103 outputs an output signal Vco of a high level [H], and when the reference voltage Vref is lower than the signal voltage Vx of the column signal line 101, the comparator 103 outputs an output signal Vco of a low level [L]. U/D counter 104 is an asynchronous counter, and down counts or up counts in synchronism with the clock signal CLK, thereby measuring a comparison period of the comparator 103 from starting comparison to finishing comparison. Since the reference voltage Vref has a RAMP waveform linearly slanting upward, the count value of the comparator 103 represents a digital voltage value. At the first reading operation, a reset component $\Delta V$ (including fixed pattern noises varying every unit pixel) is read. At the second reading operation, a signal component corresponding to an incident light volume of unit pixel is read in addition to the reset component $\Delta V$ in the same operation.

In the normal frame rate mode, when a signal is read from one pixel, U/D counter effects down counting at the first reading operation until the comparator output Vco changes from [H] level to [L] level to measure a comparison period in the first reading operation. At the second reading operation, U/D counter effects up counting until the comparator output Vco changes from [L] level to [H] level to measure a comparison period in the second reading operation. When the up counting is effected after the down counting, the comparison period in the first reading operation is deducted from the comparison period in the second reading operation, that is, (comparison period in the second reading operation)−(comparison period in the first reading operation)=(signal component Vsig+reset component $\Delta V$+ADC offset component)−(reset component $\Delta V$+ADC offset component)=(signal component Vsig). Deduction process by the second reading operation and down counting of U/D counter 104 eliminates the reset component $\Delta V$ including variation in unit pixel and ADC offset component, whereby only signal component Vsig corresponding to the incident light volume of unit pixel can be obtained. As described, CDS/ADC circuit can perform operation of CDS circuit in addition to operation of AC circuit.

Meanwhile, in the high speed frame rate mode, the counting result with respect to an unit pixel on a row is kept, and with respect to an unit pixel in the following row, down counting is effected from the previous counting result in the first reading operation and up counting is effected in the second reading operation are effected. Therefore, CDS/ADC circuit performs CDS/ADC process, and adds pixel values thereafter, which means that CDS/ADC circuit operates as a vertical addition circuit, too.

In the normal frame rate mode (no addition), at the time when U/D counter 104 has finished its counting operation with respect to an unit pixel in a row, the transmission switch 105 is made ON, allowing the counting result of U/D counter 104 to be transferred to the memory 106. Meanwhile, in the high speed frame rate mode for reading pixel addition (for example, N=2), when U/D counter 104 has finished its counting operation with respect to an unit pixel in a row, the transmission switch 105 keeps OFF, and at the time when U/D counter 104 has finished its counting operation with respect to an unit pixel in the following row, the transmission switch 105 is made ON, allowing the counting result of U/D counter 104 with respect to two pixels in a vertical line to be transferred to the memory 106. Since the counting result is selectively transferred to the memory 106 through the transmission switch 105, the counting operation and reading operation for reading and supplying the counting result to a horizontal line are controlled separately. In this manner, analog signal supplied to each row from each unit pixel circuit 108 is converted into a digital signal of N bits by operations of the comparator and counter in ADC circuit. The digital signal is stored in the memory 106. In response to a column selecting signal from a horizontal scanning circuit (H register, row scanning circuit) 109, digital signals of N bits converted by ADC circuit are read out to the horizontal lines in order and output from an output circuit through the horizontal lines as image pick-up data.

(3) High Speed Reading of Image Pick-Up Signal

The digital image pick-up signals read normally or read to be added are sequentially converted to serial digital signals by the parallel/serial converting circuit, and the digital signals are transferred to DSP unit. To shoot a moving image of a high resolution at a high frame rate, it is necessary to transfer the image pick-up signals to DSP unit at a high speed. In a general CMOS input/output circuit, an amplitude of an input/output signal is swung to the full range of a power voltage, and therefore much power is consumed, resulting in delay in data transferring speed. On the contrary, in the input/output circuit of CML (Cent Mode Logic, current mode logic), transistors are used in the under-saturation range and are operated in low impedance range. The transistors operate to turn on or off current rather than swinging voltage, thereby swinging a signal amplitude within a narrow range with the center at (vdd −0.4 V). Current charging and/or discharging stray capacitance is reduced and therefore the transistors can operate at a high speed. LVDS (Low-voltage Differential Signaling) is a differential signaling system using two signal lines to convey information. LVDS is capable of transferring data at a speed of several hundreds to several thousands Mbps (Mega bits per sec.) per single channel. LVDS is used in a differential data transmitting system of low power consumption in a mW level, and reduces the number of signal lines in an internal bus. LVDS is used as a digital input/output interface between a monitor display device and a personal computer.

In LVDS, employment of a current mode driver and a low voltage within a voltage range of 0.3 V with the center at +1.2 V reduce common mode noises, and therefore LVDS has high tolerance for noises over a wide frequency range. CMOS circuit uses an input/output interface of a low voltage and differential signaling system such as CML and LVDS, which are capable of serially transferring data at a high speed, and further outputs a digital image pick-up signal converted to a serial signal through an output circuit (transceiver) of the image pick-up element, thereby transferring the signal to DSP (Video Signal Processing circuit) at the following stage with less number of terminals. In an input circuit (receiver) at DSP side, a parallel/serial converter circuit converts the received serial digital signal to a parallel digital signal. The parallel digital signal is used as a digital image pick-up signal to be subjected to a image signal process.

For example, when 10 bit parallel LVDS output is used, and a image pick-up signal (900×2200 pixels=about 6 millions pixels, 10 bits per pixel) is transferred at a pixel rate of about 400 MHz, an image signal of a high resolution of about 6 millions can be transferred to DSP at a high speed of more than 60 frames per second (60 fps). In the same manner, compressed data with vertical 5×addition reading, or vertical 1/5 thin out (about 6 millions/5 pixels=about 1.2 millions pixels) can be transferred at a high speed of about 300 fps.

(4) High Speed DSP

The image pick-up signal is converted to a digital signal by CDS/ADC circuit contained in CMOS image sensor as shown in FIG. 1. The digital signal is transferred to DSP as a serial or parallel digital signal. DSP applies shading correction and black level correction and missing pixel correction on the received image pick-up signal in a previous stage, and then the signal is amplified by a digital AGC circuit and subjected to a white balance adjustment and color balance adjustment. In the general RGB color image pick-up element, in accordance with the mosaic like RGB color filter arrangement provided in front of the image pick-up element, a pixel value of a color difference component is obtained from Bayar data including pixels each having only one color and from pixel values of pixels in the vicinity of the pixel, thereby performing a color correcting process to convert into a digital image data including pixels each having a gray level of each RGB color difference component with respect to each surface unit. In the high speed spectral shooting camera of the present embodiment, the image pick-up element is not provided with a color filter for each pixel, but all the surface units of the image pick-up element receive light at the same time, whereby spectral images having respective wavelength bands are sequentially shot at a high speed with the transmitting wavelength characteristic of the filter switched sequentially.

The spectral images are corrected based on variation in the spectral characteristic of the filter with respect to each wavelength band, and the tristimulus values R, G, B of each surface unit are calculated, whereby the corrected spectral images are subjected to multi-plane addition to be combined, or the spectral images are converted into an image signal of a wide band in the space coordinates such as general R, G, B (conversion to RGB signal). Further, in the same manner in which an image signal generated by an image pick-up element provided with a general filter is processed, the digital image signal of RGB system is subjected to gray level correction and gamma correction, and thereafter is temporarily stored in the buffer memory (B) 81. The signal is reproduced and displayed on LCD monitor and/or an electronic finder (EVF), or the signal is converted from RGB signal to an image signal in a predetermined color space such as YUV or YCbCr signal by the color matrix circuit 75, and further is compressed and encoded into a still image data of JPEG format or moving image data of MPEG 4 or H.264 format. These still image data and moving image data are stored in the memory card 25. According to need of display size or recording image size, these still image data and moving image data are subjected to a resolution converting process such as resizing process, and interpolation process, scaling up/down process to resize the pick-up image size to a different image size.

(5) Color Image Shooting Process

In general, a function of a spectral reflectivity of a reflecting object in the space of three dimension coordinates in a wavelength ($\lambda$) at a time (t) is expressed in O(x, y, z, t, $\lambda$). Then, when the object is illuminated by a light source of a spectral emissivity E($\lambda$) and the object is focused on through a lens of a spectral transmission factor TL($\lambda$) and shot with a camera having a filter of a spectral transmission factor TFi($\lambda$) and an image pick-up element of a spectral sensitivity S($\lambda$), an output of the camera, that is, a two dimension image Vi(x, y) will be expressed by the following expression:

$$Vi(x, y) = \iiint TL(\lambda)TFi(\lambda)S(\lambda)t(t)A(z)O(x, y, z, t, \lambda)E(\lambda)\,d\lambda\,dt\,dz \quad (13)$$

where t(t) denotes an exposure time, A(z) denotes a focus function (three dimensions/two dimensions conversion function) of the lens.

The exposure time "t" of the camera can be approximated by a square wave function of a predetermined ON/OFF. Paying attention to the color reproducibility, and simplifying the coordinates, time function, lens focusing function, then we obtain the following expression:

$$Vi(x, y) = \int TL(\lambda)TFi(\lambda)S(\lambda)O(x, y, \lambda)(\lambda)\,d\lambda \quad (14)$$

In the case of an image of 3 bands of RGB based on the conventional three primary colors, the spectral transmission factor TFi($\lambda$) corresponds to color filters of TFR($\lambda$), TFG($\lambda$) and TFB($\lambda$), where i=R, G, B in the above expression. In the case of the spectral camera (digital camera 1) of the present embodiment or a spectral images each having a narrow wavelength band, the spectral transmission factor T·($\lambda$) corresponds to filters of wavelength bands TF1($\lambda$), TF2($\lambda$), ... TFn($\lambda$), where the band number i=1, 2, ... n in the above expression. (Note that, when the spectral reflectivity O($\lambda$) of the reflecting object and spectral emissivity E($\lambda$) of the light source are substituted with a spectral radiance Oe($\lambda$) of the object in the above expression, an emitting body may be treated in the same manner.)

(6) Color Reproducibility Using Three Primary Colors

In general color reproducibility of decomposed images of three colors, VR, VG, and VB, for example, using color matching functions in CIE-XYZ color coordinate system, $x(\lambda)$, $y(\lambda)$, $z(\lambda)$, the so-called colorimetric color reproduction is performed to make the original tristimulus values (Xi, Yi, Zi) of the object correspond to the following (XO, YO, ZO).

$$XO = KO \int O(\lambda) E(\lambda) x(\lambda) d\lambda$$

$$YO = KO \int O(\lambda) E(\lambda) y(\lambda) d\lambda$$

$$ZO = KO \int O(\lambda) E(\lambda) z(\lambda) d\lambda \tag{15}$$

where $KO = 100[\%]/\{\int E(\lambda) y(\lambda) d\lambda\}$

In the case where a hard copy of a recorded image is observed with a illumination light source of another spectral emissivity $E'(\lambda)$, when the spectral emissivity $E(\lambda)$ of the light source and spectral reflectivity $O(\lambda)$ of the object are substituted with the spectral emissivity $E'(\lambda)$ and spectral reflectivity $O'(\lambda)$ (or spectral density) of the image, respectively, tristimulus values (Xh, Yh, Zh) will be expressed by the following expression.

$$Xh = K \int O'(\lambda) E'(\lambda) x(\lambda) d\lambda$$

$$Yh = K \int O'(\lambda) E'(\lambda) y(\lambda) d\lambda$$

$$Zh = K \int O'(\lambda) E'(\lambda) z(\lambda) d\lambda \tag{16}$$

where $K = 100[\%]/\{\int E'(\lambda) y(\lambda) d\lambda\}$

Hard copies of a film and printed material and an electronic display are different in expressive form, conversion matrix and LUT (Lookup Table, Conversion Table), they will be processed in the same manner as above. As apparent for the above formulas (15), (16), the tristimulus values of the object and image are depending on their spectral emissivities $E(\lambda)$, $E'(\lambda)$ of the illumination light source.

(7) Color Reproducibility of a Spectral Image

In the case of the spectral image in the present embodiment, colors are reproduced as described below. From the formula (14), $$Vi(x, y) = \int TL(\lambda) TFi(\lambda) S(\lambda) O(x, y, \lambda)(\lambda) d\lambda \tag{14}$$

where $Vi(x, y)$ denotes a two dimension image, $E(\lambda)$ is the spectral emissivity of the light source, $TL(\lambda)$ is a spectral transmission factor of the image pick-up lens, $TFi(\lambda)$ is the spectral transmission factor of the i-th filter, $S(\lambda)$ is the spectral sensitivity of the image pick-up element, and $O(x, y, \lambda)$ is the spectral reflectivity of the object.

(8) Conversion to an Image of a Wide Wavelength Band

In DSP to which plural pieces of spectral image data are transferred at a high speed, the inverse ratio of an actual spectral transmission factor $T(\lambda i)$ to the ideal spectral characteristics transmission factor (100%) or to the standard spectral transmission factor $TO(\lambda i)$, and the inverse ratio of the actual spectral sensitivity $S(\lambda i)$ to the standard spectral sensitivity $SO(\lambda i)$ are calculated for every wavelength band, and brightness signal $V(x, y; \lambda i)$ of the image of wavelength band $\lambda i$ is multiplied by the calculated inverse ratios, whereby a spectral image $V(x, y; \lambda i)$ which is corrected in sensitivity variation in each wavelength band is obtained, wherein spectral characteristics and inherent variation data of the camera such as the spectral transmission factor $T(\lambda)$ of the image pick-up lens and/or interference filter and the spectral sensitivity $S(\lambda)$ of the image pick-up element are previously stored in the memory. That is, $$V'(x, y; \lambda i) = V(x, y; \lambda i) \times \{TO(\lambda i)/T(\lambda i)\} \times \{SO(\lambda i)/S(\lambda i)\} \tag{17a}$$

or $$V'(x, y; \lambda i) = V(x, y; \lambda i) \times \{1/T(\lambda i)\} \times \{1/S(\lambda i)\} \tag{17b}$$

The corrected spectral image $V'(x, y; \lambda i)$ is multiplied by color matching functions $r(\lambda i)$, $g(\lambda i)$, $b(\lambda i)$ for each wavelength band of the spectral image, whereby the tristimulus values R, G, B of each surface unit (x, y) are obtained. The spectral images are converted into R, G, B color data.

$$Ri(x, y) = V'(x, y; \lambda i) \times r(\lambda i)$$

$$Gi(x, y) = V'(x, y; \lambda i) \times g(\lambda i)$$

$$Bi(x, y) = V'(x, y; \lambda i) \times b(\lambda i) \tag{18}$$

Further, in the multi-plane addition circuit in DSP, RGB values of the surface unit (x, y) of each wavelength band ($\lambda i$) are added and combined, thereby converted into color image data of a wide wavelength band RGB.

$$R(x, y) = \Sigma i Ri(x, y)$$

$$G(x, y) = \Sigma i Gi(x, y)$$

$$B(x, y) = \Sigma i Bi(x, y) \tag{19}$$

The brightness signal may be subjected to gray level correction and gamma correction so as to meet the gamma characteristic of the standard monitor. Further, the brightness signal may be converted to data such as rgb chromaticity values and YUV(CrCb) signal of each pixel (x, y) in other color space coordinates In this way, the spectral images of plural wavelength bands which were sequentially shot within an extremely short period almost at the same timing and at a high speed are read and combined at a high speed, whereby one piece of high-resolution image data of a wide wavelength band, having high color reproducibility is generated and output or recorded.

Interference filter using a piezoelectric actuator

As described above, deflecting plates are provided on both sides of the liquid crystal and crystal plate in the stacked LCFT to block off unnecessary polarized light. In stacked LCFT, the larger number of filter layers, the larger number of deflecting plates. Therefore, inconveniences are invited, such as limitation of a high speed shooting due to the decreased transmission factor, a long raising time and long switching time of a liquid crystal display.

The digital camera of the present embodiment uses the spectral filter consisting of a combination of plural interference filters of a piezoelectric actuator type in place of LCTF and LCFP using flexibility of liquid crystal and plural deflecting plates. The interference filter of a piezoelectric actuator type uses piezoelectric actuators that drives a distance between two sheets of transparent plates in the fine range of several micron meters to select a transmitting wavelength which is allowed to pass through, wherein the transparent plate is coated with multi films of dielectric substance such as FP (Fabry-Perot) etaron.

(1) Multi-Layer Interference Filter of a Piezoelectric Actuator Type

Figure 9:
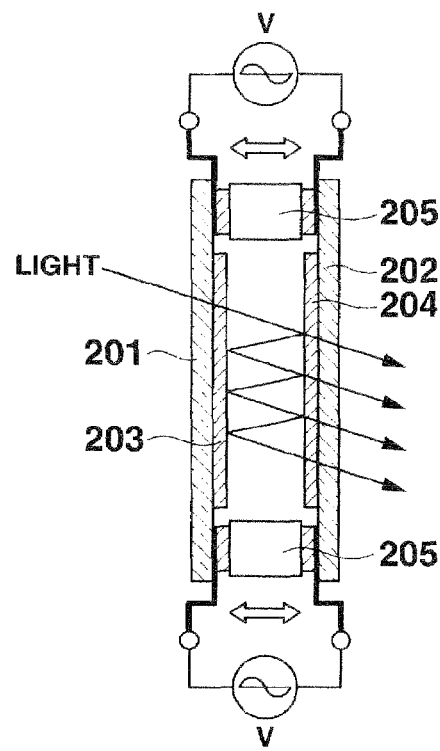
FIG. 9 is a cross-sectional view of a multi-layer interference filter using piezoelectric actuators.

FIG. 9 is a cross-sectional view of the multi-layer interference filter using piezoelectric actuators. The multi-layer interference filter has two base plates 201, 202, such as grass plates and/or crystal plates, which are disposed in parallel with each other. Reflecting films 203, 204 such as thin metal films and multi thin films of a dielectric body, are attached to the base plates 201, 202, and further piezoelectric actuators 205, 205 are disposed between the two base plates 201, 202 to keep a predetermined distance between the two base plates.

When a voltage is applied to the both piezoelectric actuators 205, 205, a distance between the reflecting films 203, 204 attached to the base plates 201, 202 is adjusted. But this simple structure has a disadvantage that the distance or gap between the reflecting films cannot be smaller than the dimension of the piezoelectric actuators, resulting in great limitation to the spectral transmission factor to be realized by the interference filter.

Figure 10:
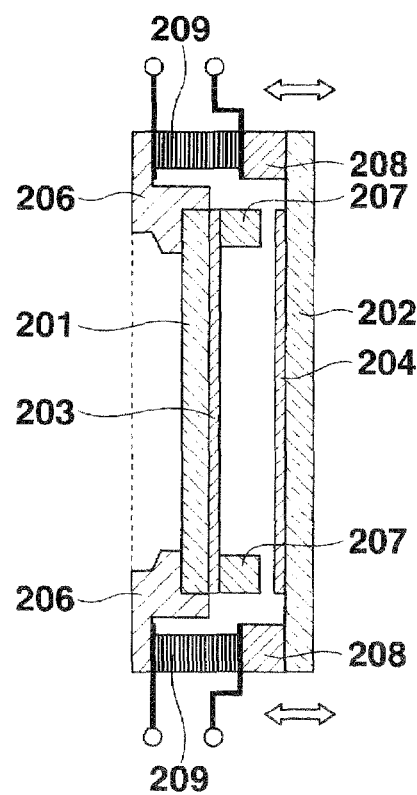
FIG. 10 is a cross-sectional view of other sample of the multi-layer interference filter using piezoelectric actuators.

FIG. 10 is a cross-sectional view of another sample of the multi-layer interference filter using piezoelectric actuators. The multi-layer interference filter has a similar construction to the filter shown in FIG. 9, but has bases 206, 206 supporting the base plate 201, and spacers 207, 207 provided between the reflecting films 203, 204, and further spacers or buffer members 208, 208 attached to other base plate 202. Stacked piezoelectric actuators 209, 209 are provided between the base plates 206 and buffer members 208, 208, as shown in FIG. 10.

Figure 11:
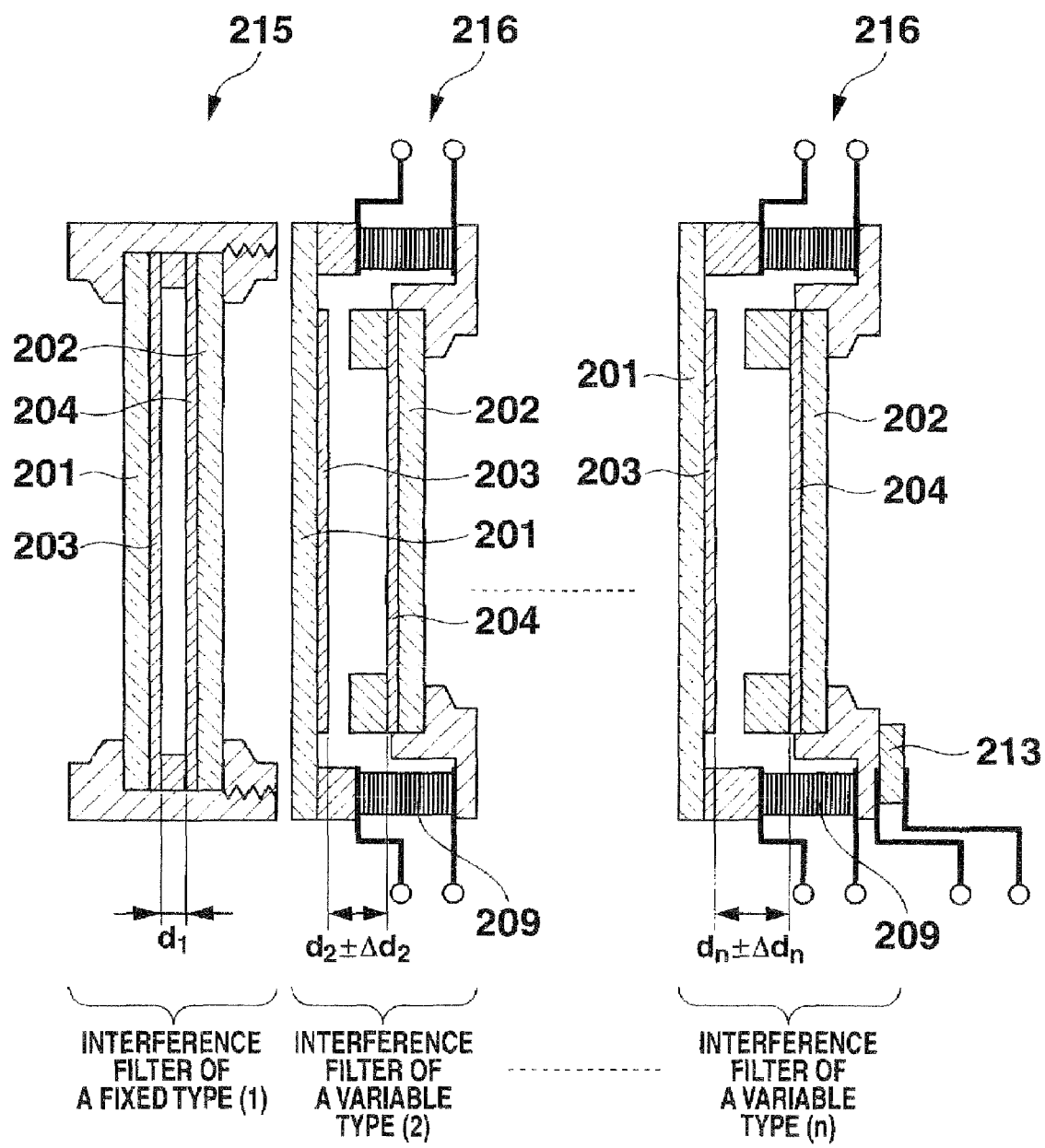
FIG. 11 is a cross-sectional view of another sample of the multi-layer interference filter using piezoelectric actuators.

FIG. 11 is a cross-sectional view of another sample of the multi-layer interference filter. This multi-layer interference filter consists of plural interference filters 216, 216 stacked on top of other, and having piezoelectric actuator elements 209, 209. Other sample of the multi-layer interference filter consists of a combination of the interference filter 216 having the piezoelectric actuator elements 209, 209 and an interference filer 215 of a fixed type. The spectral characteristic of the interference filter 216 of a piezoelectric actuator type is adjusted based on a temperature detected by a temperature sensor 213 such as a thermistor, and the spectral characteristics of the interference filters are combined together, whereby the total characteristic of the interference filter is adjusted to a desired wavelength band. This type of multi-layer interference filter can be also used as a variable filter in the spectral camera in place of LCFT and LCFP described above. When the multi-layer interference filter of a piezoelectric actuator type is used, liquid and a deflecting plate are not necessary, and a spectral shooting is allowed at high transmission factor to obtain a spectral image of a high resolution. As described, since the multi-layer interference filter of a piezoelectric actuator type can change the wavelength band at a high speed, the spectral shooting can be performed at a higher speed than the conventional camera, and therefore, when images sequentially shot are combined into an image of a wide wavelength band, a high resolution image reduced in hand shake can be obtained.

(2) Structure and Displacement Value of Piezoelectric Actuator

The stacked piezoelectric actuator has large driving force of 3 Kg level per mm, and can be adjusted its displacement value up to several ten µm at high accuracy of 0.01 µm, and further is superior in response. Since this stacked piezoelectric actuator is of a capacitance type, less power is consumed, but a displacement of a single layer filter is several microns and a displacement of a stacked layer filter is small in range of 0.05 mm. The displacement value "L" of the stacked piezoelectric actuator is given by the following formula.

$$L = d33 \cdot V \cdot N [m] \qquad (20)$$

where d33 is a piezoelectric constant (for example, d33=620 to 770 pm/V), and V is a driving voltage, and N is the number of staked layers.

Figure 12:
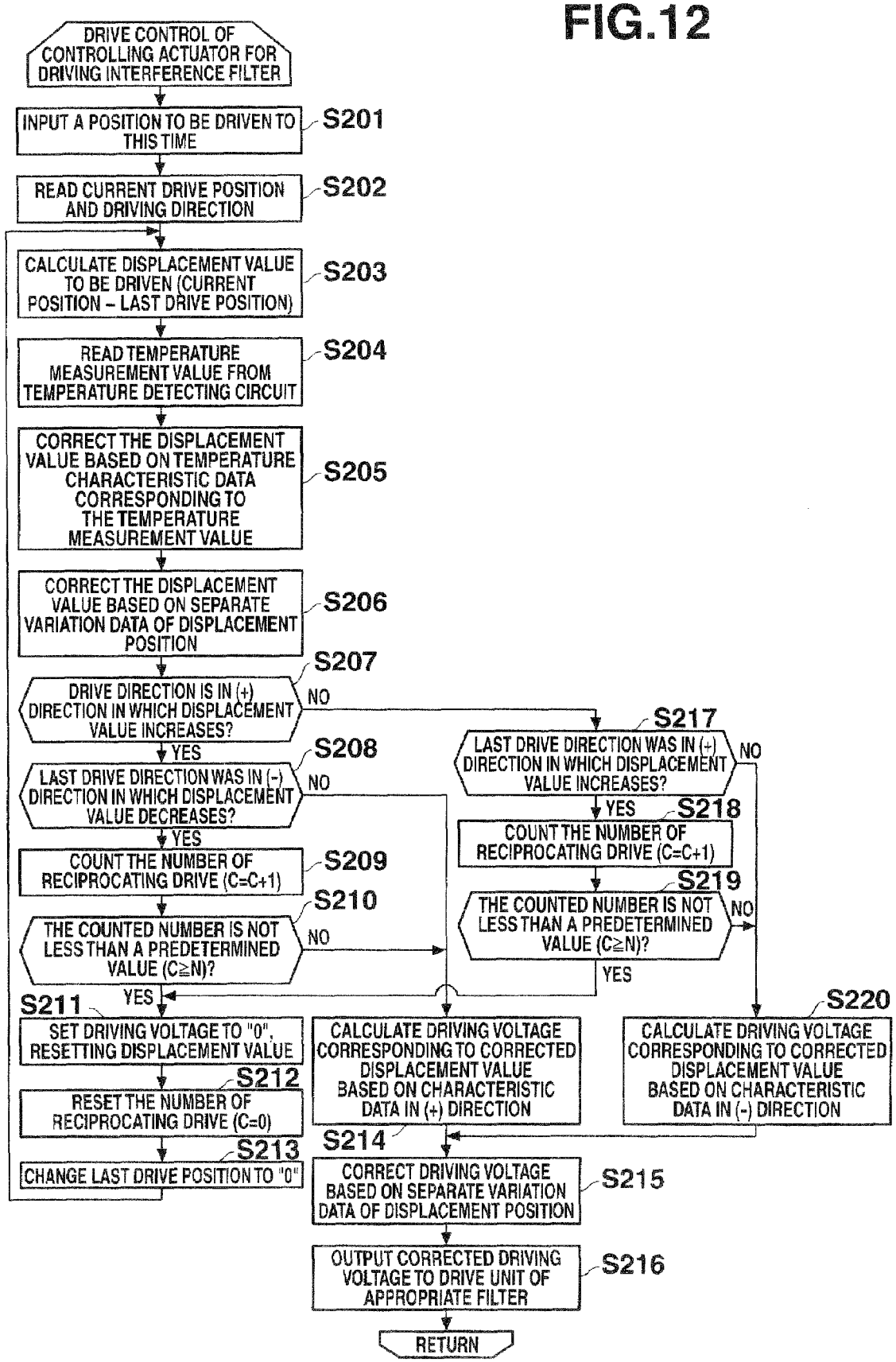
FIG. 12 is a flow chart of a drive control process of the piezoelectric actuator in each layer of the interference filter.
Figure 13:
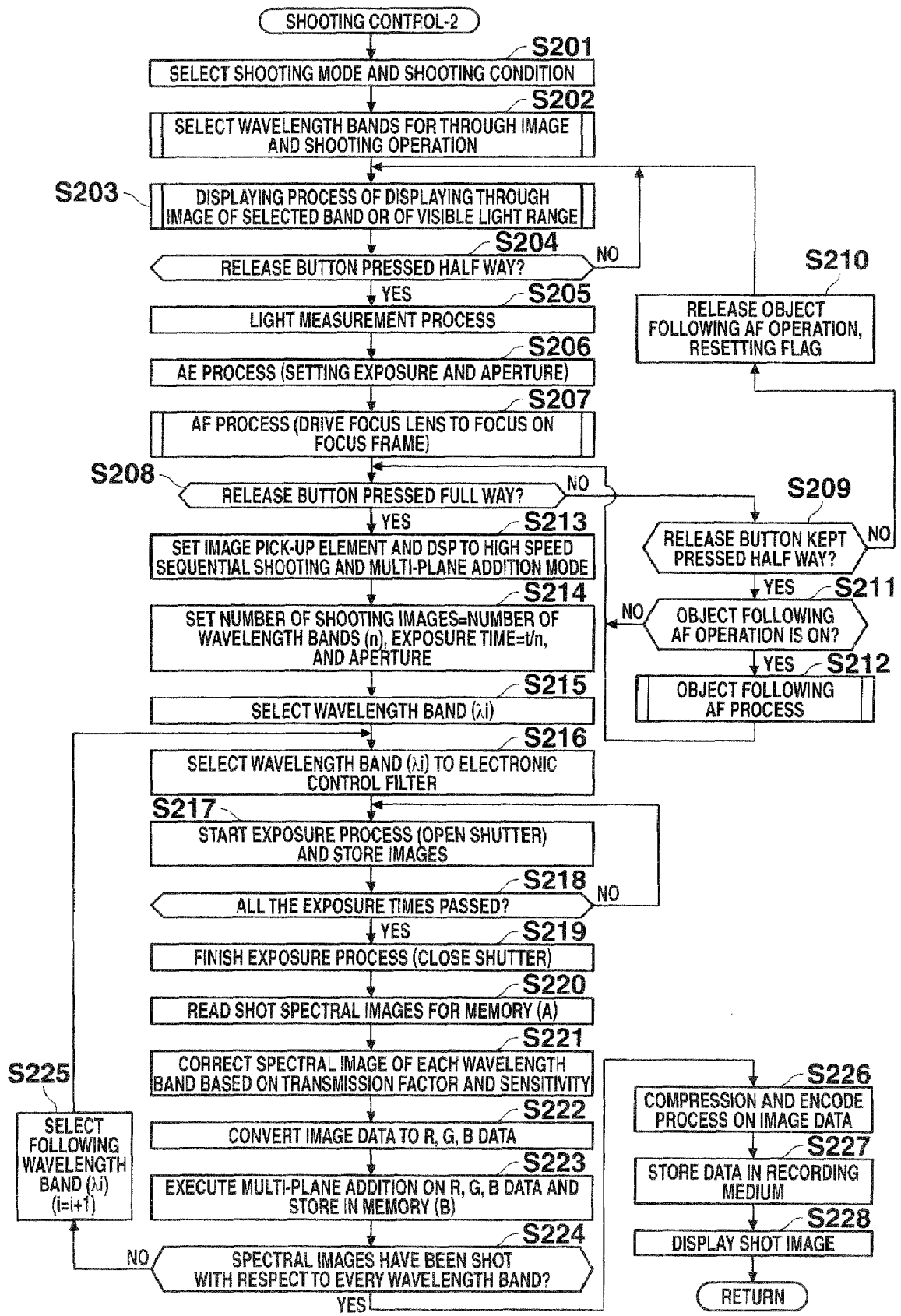
FIG. 13 is a flow chart of a shooting control process in the second embodiment of the invention.
Figure 14:
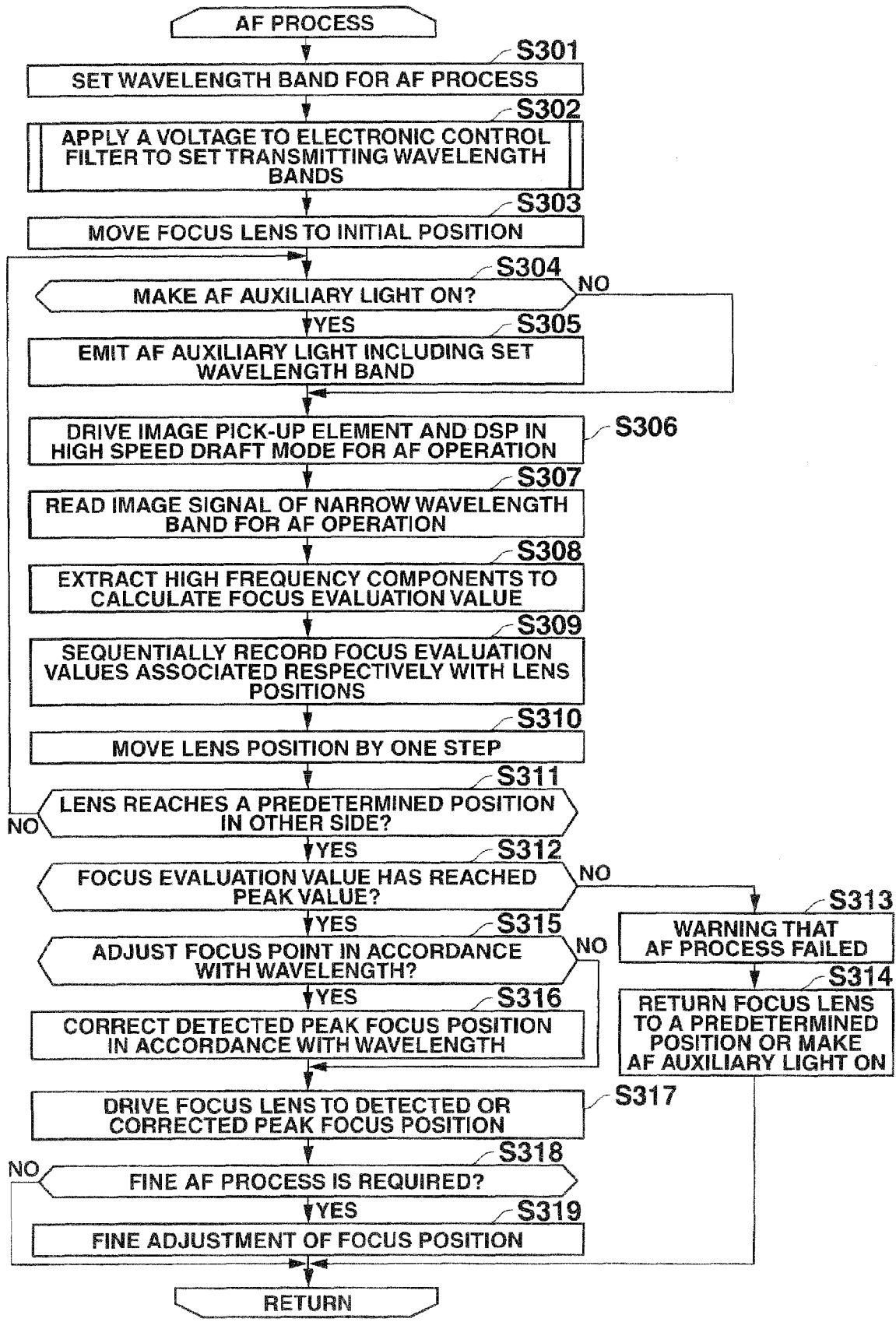
FIG. 14 is a flow chart of AF process in the second embodiment of the invention.
Figure 15:
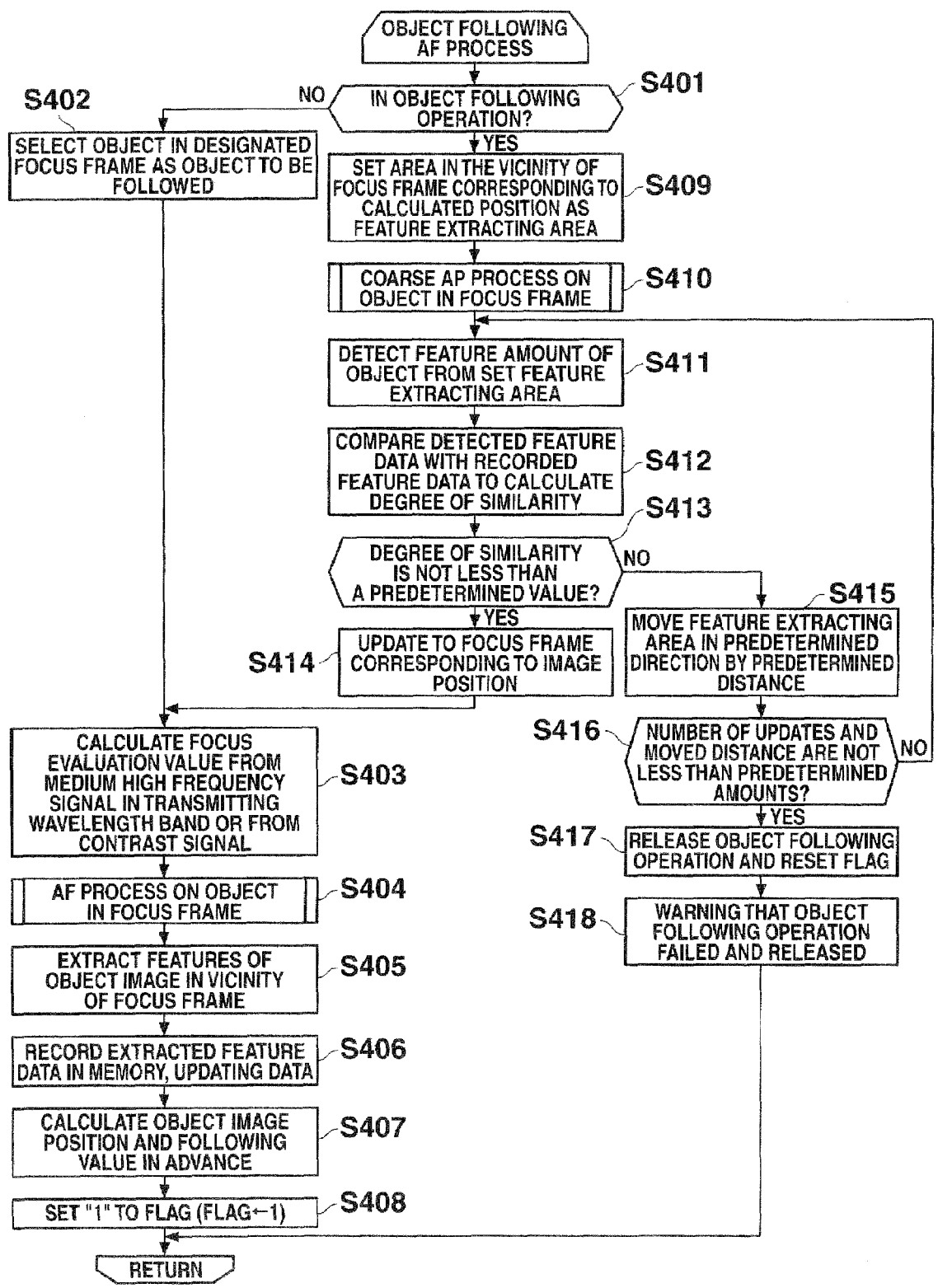
FIG. 15 is a flow chart of an object following AF process in the second embodiment of the invention.

(3) Correction of Temperature and History of Actuator of the Interference Filter FIG. 12 is a flow chart of a drive control of the piezoelectric actuator in each layer of the interference filter. When the multi-layer interference filter of a piezoelectric actuator type shown in FIG. 11 is used in the spectral camera, drive history data of the actuator, and hysteresis characteristic data of driving voltage to drive displacement value in the filter driving unit are previously stored in a non-volatile memory such as EEPROM, wherein the drive history data includes a driving voltage, drive displacement value, and driving direction of the actuator which drove the interference filter last time. Based on a drive displacement value required at the current, and the drive history data and hysteresis characteristic data stored in the non-volatile memory, a driving voltage is adjusted, which is necessary to realize the current drive displacement value in the interference filter. The interference filter is driven with the adjusted driving voltage.

The drive control of the piezoelectric actuators will be described in accordance with the flow chart of FIG. 12. A current position is entered at step S201. The current drive position and driving direction are read from the data memory 24 at step S202. The following formula is calculated at step S203. (Displacement value to be driven)=(Current drive position)−(last or previous drive position) A measured temperature is read from the temperature detecting circuit (temperature sensor 213) at step S204. The displacement position to be driven is corrected based on temperature characteristic data corresponding to the measured temperature read from the temperature sensor 213 at step S205. Further, the displacement value to be driven is corrected based on separate variation data of displacement position at step S206. It is judged at step S207 whether or not the driving direction of the corrected displacement value is in a direction (+) in which the displacement value increases.

When the driving direction is in the direction (+) in which the displacement value increases (YES at step S207), it is judged at step S208 whether or not the previous driving direction was in a direction (−) in which the displacement value decreases. When the current driving direction is in the direction (+) in which the displacement value increases, and the previous driving direction was in the direction (−) in which the displacement value decreases (YES at step S208), the number (C) of reciprocating drive is incremented (counter C=C+1) at step S209. It is judged at step S210 whether or not the number (C) of reciprocating drive indicated by the value of the counter C is not less than a predetermined value (N), that is, C☐N is true. When C☐N is true (YES at step S210), the driving voltage is set to "0", resetting the displacement value at step S211. Further, the number (C) of the reciprocating drive is reset (C=0) at step S212. The previous drive position is changed to "0" at step S213, and processes at steps S203 to S213 are repeatedly performed.

When the reverse drive and/or reciprocating drive are repeated in the direction (+) and in the direction (−), errors in the drive displacement value due to the hysterisis character are accumulated and an error of the displacement position increases, resulting in lowering accuracy of driving to the desired transmitting wavelength band of the interference filter. When the reverse drive and/or reciprocating drive are repeated more than the predetermined times, the driving voltage of the piezoelectric actuator is reset to "0", and the actuator is driven to the current drive position in the direction (+), resetting the histerisis character of the actuator.

Meanwhile, when the previous driving direction is in the direction (+) in which the displacement value increases (NO at step S208), or when C☐N is not true (NO at step S210), a driving voltage corresponding to the corrected displacement value is obtain based on characteristic data in the direction (+) at step S214. The driving voltage is corrected based on separate variation data of displacement characteristic at step S215, and the corrected driving voltage is applied to a drive unit of the filter at step S216.

When the driving direction is in the direction (−) in which the displacement value decreases (NO at step S207), it is judged at step S217 whether or not the previous direction was in the direction (+) in which the displacement value increases. When the current driving direction is in the direction (−) in which the displacement value decreases, and the previous driving direction was in the direction (+) in which the displacement value increases (YES at step S217), the number of the reciprocating drive is incremented (counter C=C+1) at step S218. It is judged at step S219 whether or not the number (C) of reciprocating drive indicated by the value of the counter C is not less than the predetermined value (N), that is, C□N is true. When C□N is true (YES at step S219), the control circuit 2 advances to step S211.

Meanwhile, when the previous direction was in the direction (−) in which the displacement value decreases (NO at step S217), or when C□N is not true (NO at step S219), a driving voltage corresponding to the corrected displacement value is obtained based on the character data in the direction (−) at step S220. Then, the control circuit 2 advances to step S215.

As described above, when the interference filter using a piezoelectric actuator shown in FIG. 12, which is controlled in accordance with the flow chart shown in FIG. 12, is employed, liquid and a deflecting plate are not necessary, and a spectral shooting can be performed at high transmission factor to obtain a spectral image of a high resolution. Since the multi-layer interference filter of a piezoelectric actuator type can change the wavelength band at a high speed, the spectral shooting can be performed at a higher speed than in the conventional camera, and therefore, when images sequentially shot are combined into an image of a wide wavelength band, a high resolution image reduced in hand shake can be obtained.

When the stacked piezoelectric actuator having a large histerisis characteristic of voltage to displacement characteristic and temperature to displacement characteristic, is used to adjust distances between mirrors attached on the layers of the multi-layer interference filter, drive histerisis and temperature correction is made on the stacked piezoelectric actuators, whereby the stacked piezoelectric actuators are controlled to reduce error in the drive displacement value. Therefore, the interference filter using piezoelectric actuators can be driven to have a desired wavelength band at a high speed, allowing a spectral shooting at a high transmission factor and a high sensitivity. Since the wavelength band of the interference filter can be switched at a high speed, spectral images are obtained by a high speed sequential shooting, and these spectral images are added to be combined into a high color-reproducibility image of a wide wavelength band, and also an image reduced in hand shake is obtained by addition/combination of the plural spectral images.

In the case where an actuator or other driving device other than the piezoelectric actuator, having large histerisis characteristic and temperature characteristic is used to drive the interference filter, or in the case where the liquid crystal Fabry-Perot etaron (LCFP etaron) having liquid crystal of a large temperature characteristic, which is changes in refraction index, is used to switch the spectral transmission character and the transmitting wavelength band, when a correcting process is applied to these elements in the similar manner as described above to correct histerisis characteristic and temperature characteristic , thereby drive accuracy is improved in tuning the filter to a desired characteristic without failure.

Third Embodiment

Figure 16:
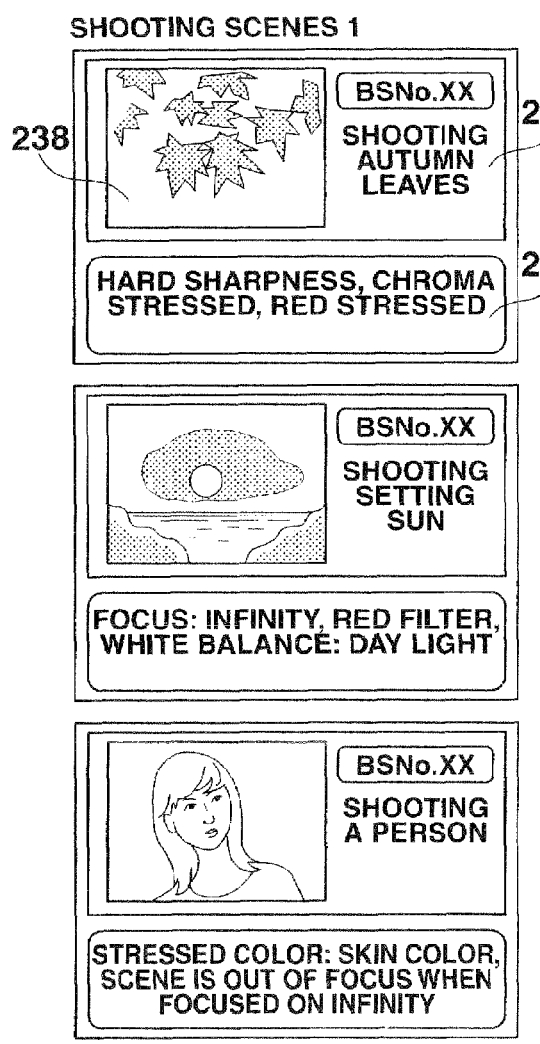
FIGS. 16 and 17 are views showing samples of a shooting data table.
Figure 17:
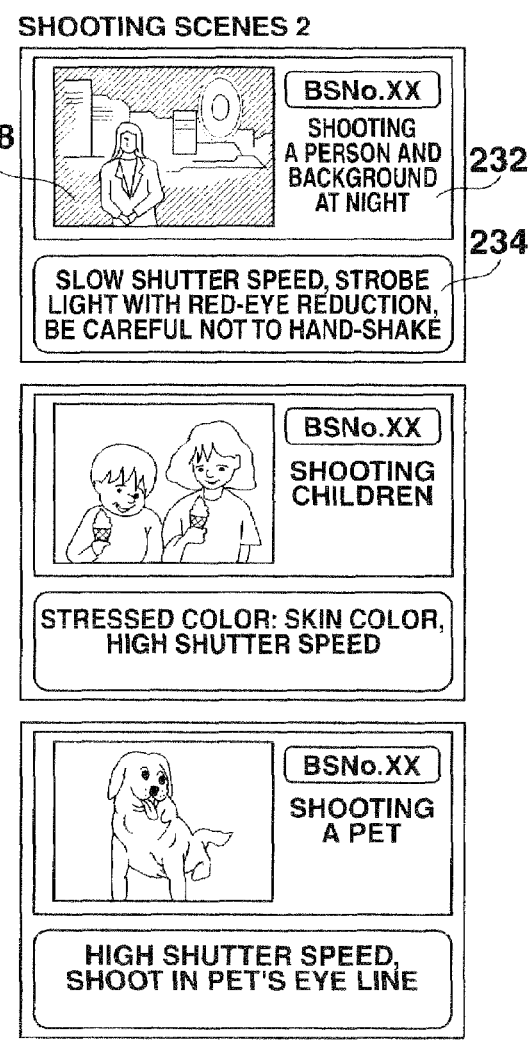

FIGS. 16 and 17 are views showing samples of shooting data tables 231, 231 for separate shooting scenes in the third embodiment. These shooting data tables are stored in the program memory 23 together with the program. The shooting data tables 231, 231 contain scene shooting data (1) shown in FIG. 16 and scene shooting data (2) shown in FIG. 17, respectively. Each scene shooting data contains plural pieces of separate scene data. Each separate scene data further contains BS No. (best scene No), scene designating data 232, appropriate sample image 233, and scene feature data 234, wherein the scene designating data 232 indicates a scene to be shot with a comment that "autumn leaves are shot", "a person and night scene are shot", and so on, and the scene feature data 234 indicates that "hard sharpness, high chroma, red stressed" and the like. Further, each shooting data table 231 contains shooting conditions for shooting an appropriate scene, including ISO sensitivity, whit balance, etc. to be set to the digital camera 1.

Figure 18:
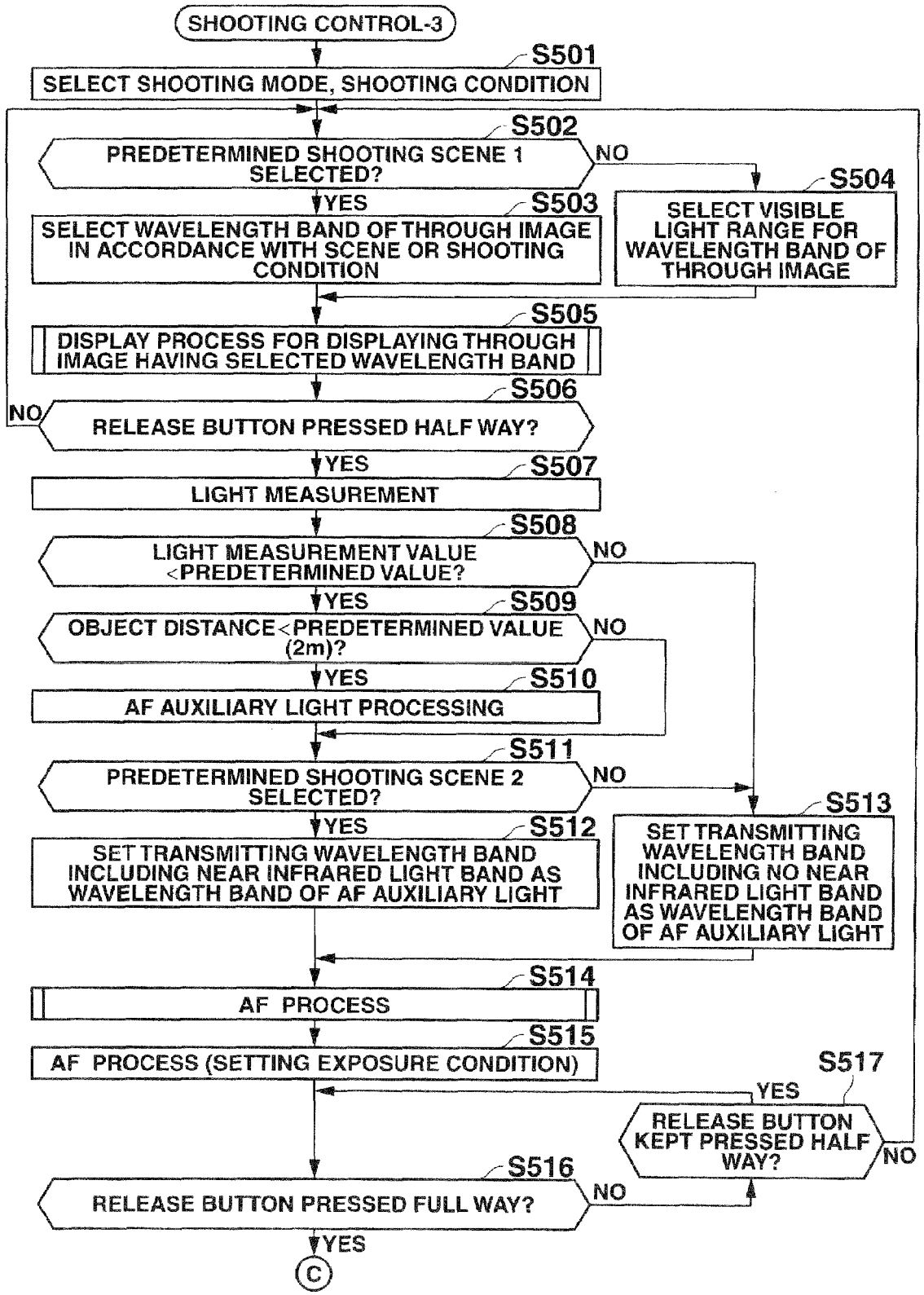
FIGS. 18 and 19 are flow charts of a shooting control process in the third embodiment of the invention.
Figure 19:
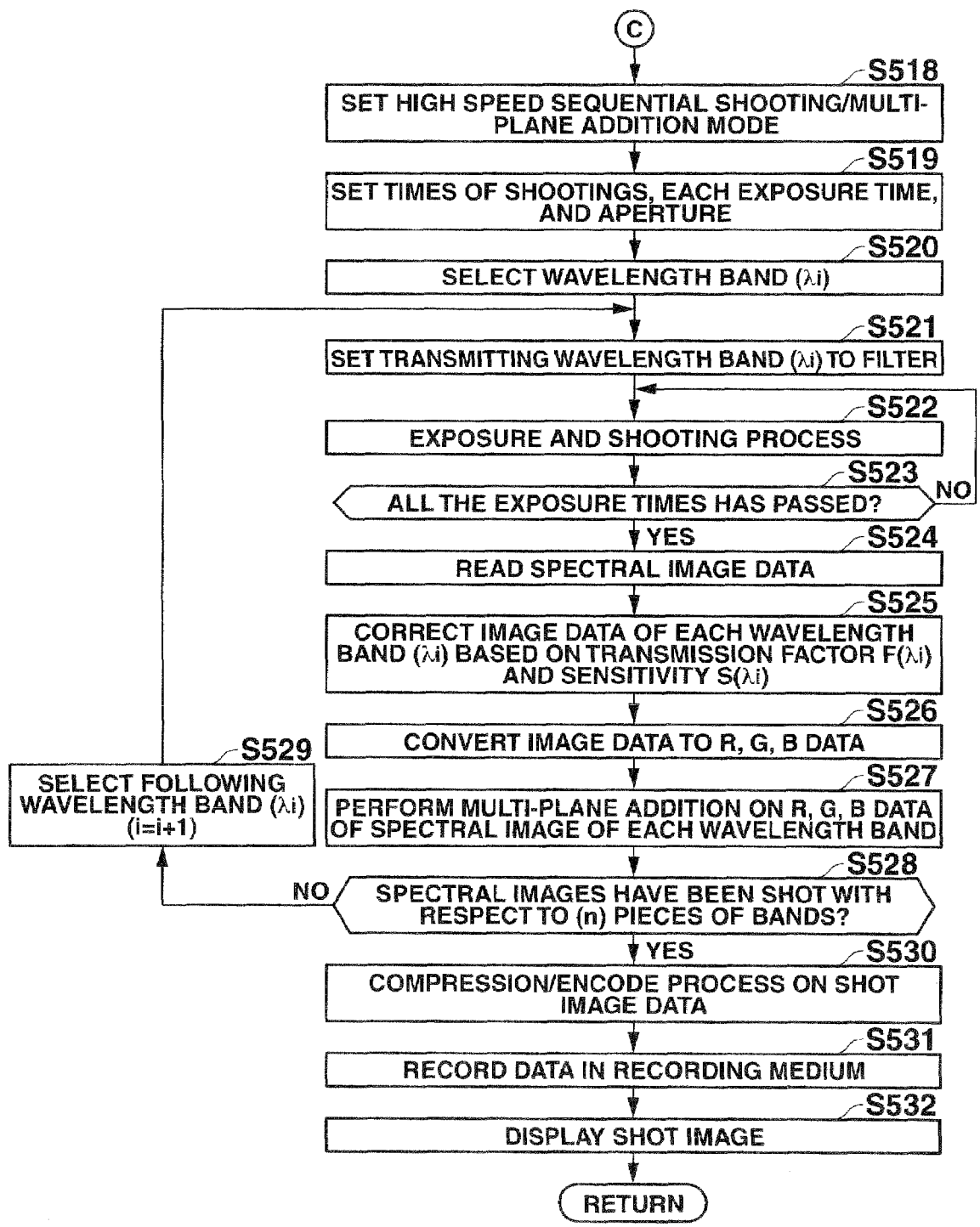

FIGS. 18 and 19 are flow charts of processes to be performed in the third embodiment. The control circuit 2 runs the program stored in the program memory 23 to perform processes in accordance with the flow charts of FIGS. 18 and 19. A shooting mode and shooting conditions are selected in response to user's manipulation on the manipulation input unit 22 at step S501. User's desired shooting scene is selected from among the shooting data table 231 to set the appropriate shooting conditions.

It is judged at step S502 whether or not the shooting scene has been selected from the scene shooting data (1) at step S501. When the shooting scene has been selected from the scene shooting data (1) (YES at step S502), the wavelength band of a monitor image is selected at step S503 in accordance with the selected scene or the shooting conditions set at step S501.

In other words, wavelength bands of monitor images corresponding respectively to "Scenery", "Autumn leaves", "Setting sun", "Green", "Person", etc. indicated in the scene designating data 232 are contained in the shooting data tables 231, 231. Therefore, with respect to the shooting scene selected at step S501, the wavelength band of the monitor image is read from those contained in the shooting data tables 231, 231 at step S503.

When the shooting scene has not been selected from the scene shooting data (1) (NO at step S502), or when a shooting scene has not been selected, the visible light range is selected as the wavelength band of the monitor image at step S504. Thereafter, a through image displaying process is performed at step S505 to display on the display unit 85 the monitor image having the wavelength band selected at steps S502 and S503.

Therefore, when the shooting scene is selected from the scene shooting data (1), the wavelength band of the monitor image is automatically selected and the monitor image is displayed on the display unit 85.

Then, it is judged at step S506 whether or not the release button has been pressed half way to make the switch S1 ON. In the embodiment, the release button has a so-called half-shutter function, wherein the release button can be pressed half way and also can be pressed full way. And when the release button is pressed half way, the switch S1 is made ON, and when the release button is pressed full way, the switch S2 is made ON. The process at steps S502 to S506 are repeatedly performed until the release button is pressed half way.

When the release button is pressed half way (YES at step S506), a light measurement process is performed at step S507. It is judged at step S508 whether or not a light measurement value obtained in the light measurement process is less than a predetermined value. When the light measurement value is less than the predetermined value [(light measurement value)<(predetermined value)], that is, when shooting is performed in a dark place, or when shooting a dark object is performed (YES at step S508), a distance to the object is measured, and it is judged at step S509 whether or not the measured distance is not larger than a predetermined distance (for example, 2 meters). When the measured distance is not larger than the predetermined distance (for example, 2 meters)(YES at step S509), the control circuit 2 performs AF auxiliary light emission process at step S510 to make at least one of the strobe light 39 and LED 41 emit light having the whole wavelength band.

In the present third embodiment, AF auxiliary light is emitted, only when the distance to the object is not larger than the predetermined distance. Therefore, useless light emission is not performed in the state where no light reaches the object. Useless light emission is prevented.

Further, it is judged at step S511 whether or not the shooting scene has been selected from the scene shooting data (2) at step S501. When the shooting scene has been selected from the scene shooting data (2) (YES at step S511), a wavelength band including the near-infrared wavelength band is selected as a wavelength band for AF process at step S512.

When the shooting scene has not been selected from the scene shooting data (2) (NO at step S511), or when the light measurement value is not less than the predetermined value [(light measurement value)□(predetermined value)], that is, when shooting is performed in bright light, or when shooting a bright object is performed (YES at step S508), a wavelength band including no near-infrared wavelength band is selected as the wavelength band for AF process at step S513. AF process is performed at step S514 to control the focus lens driving unit 34, thereby focusing on an object in a predetermined focus area. And further, AE process is performed to set an exposure condition at step S515.

It is judged at step S516 whether or not the release button has been pressed full way to make the switch S2 ON. When the release button has not been pressed full way (NO at step S516), it is judged at step S517 whether or not the release button keeps being pressed to make the switch S1 ON. When the release button is released and switch S1 does not keep ON (NO at step S517), the control circuit 2 returns to step S502.

When the release button has been pressed full way to make the switch S2 ON (YES at step S516), the control circuit 2 advances to step S518 in FIG. 19, where the image pick-up element 60 and DSP unit 67 are set to the high speed sequential shooting and multi-plane addition mode. The number (n) of sheets of images to be sequentially shot, or the number (n) of transmitting wavelength bands is set, and an exposure time "t" for shooting a single sheet of image is set, and further an exposure time "t/n" for each wavelength band is set using the exposure time "t" and the number (n) of transmitting wavelength bands, and an aperture is set at step S519. In other words, when the exposure and shooting process is performed with respect to (n) pieces of transmitting wavelength bands within the exposure time "t" for shooting a single sheet of image, an exposure time for each transmitting wavelength band will become "t/n", and therefore this exposure time (t/n) is set.

The first wavelength band (λi=λ1) is selected from (n) pieces of wavelength bands into which the wavelength band of the image which is divided at step S520. The first wavelength band (λi=λ1) may be selected from a wavelength band at the shortest wavelength side or a wavelength band at the longest wavelength side. The control circuit 2 applies a predetermined driving signal to the electronic control filter (spectral filter 59) at step S521 to set the transmitting wavelength band of the filter to the wavelength band λ1 selected at step S520. Further, the control circuit 2 performs the exposure (shutter open) and shooting process, and stores image data from the image sensor unit 63 in the buffer memory (A) 70 at step S522. Therefore, spectral image data of the wavelength band λ1 transmitting through the spectral filter 59 is stored in the buffer memory (A) 70 during the process at step S522.

Then, it is judged at step S523 whether or not all the exposure times "t/n" reset at step S519 have passed. When all the exposure times have passed (YES at step S523), the control circuit 2 finishes, at step S524, an exposure operation and reads from the buffer memory (A) 70 the spectral image data shot and stored in the buffer memory (A) 70 at step S522.

Further, the spectral image data read from the buffer memory (A) 70 is corrected with respect to each wavelength band (λi) based on the transmission factor F(λi) of the spectral filter 32 and sensitivity S(λi) of the image pick-up element at step S525. The corrected spectral image data is converted into R, G, B data at step S526. For example, a brightness value V(x, y; λi) of each pixel in the spectral image data is multiplied by a color matching function, whereby the spectral image data is converted into R, G, B data. Further, R, G, B data of each pixel of the spectral images which have been shot every period of "t/n" are subjected to multi-plane addition and combined at step S527, whereby combined images are successively generated, and the images generated successively, that is, the updated images are successively stored in the buffer memory (B) 81.

Then, it is judged at step S528 whether or not spectral images for (n) pieces of wavelength bands have been shot, that is, whether or not i□n is true. When i□n is not true, and spectral images for (n) pieces of wavelength bands have not been shot (NO at step S528), a value of "i" is incremented (i=i+1), and a following wavelength band (λi) indicated by the value of "i" is selected at step S529. Then, the processes at steps S521 to S529 are performed again. Therefore, the processes at steps S521 to S529 are repeatedly performed (n) times at a timing of "t/n". When these processes have been repeatedly performed (n) times, it is determined that i□n is true (YES at step S528), and the control circuit 2 advances fro step S528 to step S530.

When the processes at steps S521 to S529 are repeatedly performed (n) times, R, G, B data of each pixel in the spectral images of (n) pieces of wavelength bands are subjected to multi-plane addition and combined into a single image, and this single combined image is stored in the buffer memory (B) 81.

The single combine image stored in the buffer memory (B) 81 is compressed and encoded at step S530. The compressed and encoded image data is stored in the image recording medium 25 at step S531. An image based on the image data stored in the image recording medium 25 is displayed on the display unit 85 at step S539.

As described above, R, G, B data of each pixel in the spectral images for (n) pieces of wavelength bands are subjected to multi-plane addition and combined into a single image, and this single image is stored in the image recording medium 25, and displayed on the display unit 85. The user is allowed to confirm on the display unit 85 the image recorded in the image recording medium 25.

In the third embodiment, the user can select a shooting scene and the selected scene is discriminated by the control circuit 2. But modification may be made to the embodiment such that the control circuit 2 automatically discriminate the shooting scene based on a through image displayed on the display unit 85, and further the processes are performed based on the automatically discriminated scene in accordance with the flow charts shown in FIGS. 18 and 19.

In the embodiments, the image subjected to multi-plane addition is finally stored in the image recording medium 25, but modification may be made such that the wavelength band of the image is selected at shooting and recording, and the selected wavelength bands are recorded in the image recording medium 25.

Further, the operation of shooting a still image is described in the embodiments but in the case of shooting a moving image, each frame image included in the moving image is processed in the similar manner in the still image shooting operation.

What is claimed is:

1. An image pick-up apparatus for shooting an object, comprising:
    a recording unit for recording data;
    a filter having a transmitting wavelength band for transmitting a light from the object, having the transmitting wavelength band;
    a spectral control unit for inputting a drive signal to the filter to change the transmitting wavelength band of the filter in plural steps;
    a single image pick-up unit disposed at a rear side of the filter, for generating image data every time when the transmitting wavelength band of the filter is changed by the spectral control unit; and
    a record control unit for recording in the recording unit plural pieces of image data generated by the single image pick-up unit;
    wherein the spectral control unit comprises:
        a drive history recording unit for recording a drive history when the transmitting wavelength band of the filter is changed in plural steps; and
        a correction unit for correcting a current driving amount and a current driving direction based on a last driving amount and a last driving direction stored in the drive history recording unit, wherein the transmitting wavelength band of the filter is changed in plural steps based on the driving amount and driving direction corrected by the correction unit when the drive signal is input to the filter.

2. The image pick-up apparatus according to claim 1, further comprising:
    a combining unit for combining the plural pieces of image data having the transmitting wavelength bands, generated by the single image pick-up unit into combined image data,
    wherein the record control unit records in the recording unit the combined image data combined by the combining unit.

3. The image pick-up apparatus according to claim 2, wherein the record control unit records in the recording unit at least one of the combined image data combined by the combining unit and the image data having the transmitting wavelength band in accordance with a previously set mode.

4. The image pick-up apparatus according to claim 3, wherein the record control unit comprises:
    a unit for recording in the recording unit image data having a previously designated transmitting wavelength band in accordance with the previously set mode.

5. The image pick-up apparatus according to claim 2, wherein correction to be made by the combining unit includes correction based on at least one of a transmission characteristic of an optical system for focusing the image of the object on the image pick-up unit, transmission characteristic of the filter and shooting sensitivity of the image pick-up unit.

6. The image pick-up apparatus according to claim 1, wherein the spectral control unit divides the transmitting wavelength band of the light from the object into plural wavelength bands, and sequentially changes the transmitting wavelength band of the filter to said wavelength bands.

7. The image pick-up apparatus according to claim 1, further comprising:
    a display unit for displaying data;
    a selection unit for selecting a transmitting wavelength band; and
    a display control unit for displaying on the display unit an image of the object based on image data which passes through the filter of the transmitting wavelength band selected by the selection unit and is shot by the image pick-up unit.

8. A method of controlling an image pick-up apparatus for shooting an object, the apparatus including a recording unit for recording data, a filter having a transmitting wavelength band for transmitting a light from the object, having the transmitting wavelength band, wherein the transmitting wavelength band is changed based on an input drive signal, and wherein the apparatus further includes a single image pick-up unit disposed at a rear side of the filter, for generating image data every time when the transmitting wavelength band of the filter is changed, the method comprising:
    inputting the drive signal to the filter, thereby changing the transmitting wavelength band of the filter in plural steps;
    making the single image pick-up unit operate to generate image data every time when the transmitting wavelength band of the filter is changed; and
    recording in the recording unit plural pieces of image data generated by the single image pick-up unit;
    wherein when the transmitting wavelength band of the filter is changed in plural steps a drive history including a driving amount and a driving direction is recorded; and
    wherein a current driving amount and a current driving direction are corrected based on a last recorded driving amount and a last driving direction; and
    wherein the transmitting wavelength band of the filter is changed in plural steps based on the corrected driving amount and the corrected driving direction when the drive signal is input to the filter.

9. An image pick-up apparatus for shooting an object, comprising:
    a recording unit for recording data;
    a filter having a transmitting wavelength band for transmitting a light from the object, having the transmitting wavelength band, wherein the transmitting wavelength band is changed based on an input drive signal;
    a first selecting unit for selecting a first transmitting wavelength band of the filter;
    a first spectral control unit for inputting a drive signal to the filter, thereby controlling the filter to allow the light from the object to pass through the filter having the first transmitting wavelength band selected by the first selecting unit;
    a function performing unit for performing a process necessary for bringing a predetermined function of the image pick-up apparatus into practice, based on the light from the object which passes through the filter having the first transmitting wavelength band under control of the first spectral control unit;
    a second selecting unit for selecting a second transmitting wavelength band of the filter;
    a second spectral control unit for inputting the drive signal to the filter, thereby controlling the filter to allow the light from the object to pass through the filter having the second transmitting wavelength band selected by the second selecting unit; and an image pick-up unit for shooting and recording in the recording unit an image of the object based on the light from the object passing through the filter having the second transmitting wavelength band selected by the second selecting unit under control of the second spectral control unit;

wherein the function performing unit performs at least one of a focusing control operation, exposure control operation and object following operation for focusing on a predetermined object, based on the light from the object, having the first transmitting wavelength band selected by the first selecting unit;

wherein the first selecting unit comprises a third selecting unit and a fourth selecting unit, and the first spectral control unit inputs the drive signal to the filter, thereby allowing the light from the object to pass through the filter having third and fourth transmitting wavelength bands selected by the third selecting unit and the fourth selecting unit;

wherein the function performing unit displays an image of the object based on the light from the object having the third transmitting wavelength band selected by the third selecting unit; and wherein the function performing unit performs the focusing control operation, exposure control operation and object following operation for focusing on the predetermined object, based on the light from the object having the fourth transmitting wavelength band selected by the fourth selecting unit.

10. The image pick-up apparatus according to claim 9, wherein the transmitting wavelength band of the filter includes a wavelength band selected from wavelength bands other than the visible light range, and the first selecting unit can select the first transmitting wavelength band of the filter from the wavelength bands other than the visible light range.

11. The image pick-up apparatus according to claim 9, wherein the first selecting unit selects the first transmitting wavelength band of the filter based on a shooting condition set to the image pick-up unit.

12. The image pick-up apparatus according to claim 11, wherein the shooting condition includes a shooting condition set based on a shooting scene selected from among plural shooting scenes previously stored.

13. The image pick-up apparatus according to claim 9, further comprising:
a scene discriminating unit for discriminating a shooting scene to be shot by the image pick-up unit,
wherein the first selecting unit selects the first transmitting wavelength band of the filter based on the shooting scene discriminated by the scene discriminating unit.

14. The image pick-up apparatus according to claim 9, further comprising:
a light emission unit for emitting auxiliary light to a surrounding space; and
a light emission control unit for adjusting a wavelength band of the light emitted by the light emission unit depending on the first transmitting wavelength band of the filter selected by the first selecting unit.

15. The image pick-up apparatus according to claim 9, wherein the second spectral control unit inputs the drive signal to the filter, thereby changing the transmitting wavelength band of the filter in plural steps, and
wherein the image pick-up unit comprises:
a combining unit for combining plural pieces of image data generated based on the lights from the object which pass through the filter having plural transmitting wavelength bands under control of the second spectral control unit; and
a data storing unit for storing the image data combined by the combining unit.

16. The image pick-up apparatus according to claim 15, wherein the combining unit corrects the plural pieces of image data depending on the second transmitting wavelength bands, and applies multi-plane addition to the corrected image data.

17. The image pick-up apparatus according to claim 9, wherein the function performing unit obtains feature information of the object based on the light from the object passing through the filter having the first transmitting wavelength band under control of the first spectral control unit, and performs a process which is necessary for bringing a predetermined function of the image pick-up apparatus into practice based on the obtained feature information of the object.

18. A method of controlling an image pick-up apparatus for shooting an object, the apparatus including a recording unit for recording data and a filter having a transmitting wavelength band which is changed in accordance with an input drive signal, the method comprising:
a first selecting step of selecting a first transmitting wavelength band of the filter;
a first controlling step of inputting the drive signal to the filter, thereby controlling the filter to allow a light from the object to pass through the filter having the first transmitting wavelength band selected at the first selecting step;
a function performing step of performing a process necessary for bringing a predetermined function of the image pick-up apparatus into practice, based on the light from the object which passes through the filter having the first transmitting wavelength band under control at the first controlling step;
a second selecting step of selecting a second transmitting wavelength band of the filter;
a second controlling step of inputting the drive signal to the filter, thereby controlling the filter to allow the light from the object to pass through the filter having the second transmitting wavelength band selected at the second selecting step; and
an image pick-up step of shooting and recording in the recording unit an image of the object based on the light from the object passing through the filter having the second transmitting wavelength band selected at the second selecting step under control at the second controlling step;
wherein the function performing step comprises performing at least one of a focusing control operation, exposure control operation and object following operation for focusing on a predetermined object, based on the light from the object, having the first transmitting wavelength band selected at the first selecting step;
wherein the first selecting step comprises a third selecting step and a fourth selecting step, and the first spectral control step inputs the drive signal to the filter, thereby allowing the light from the object to pass through the filter having third and fourth transmitting wavelength bands selected by the third selecting step and the fourth selecting step;
wherein an image of the object is displayed based on the light from the object having the third transmitting wavelength band selected at the third selecting step; and
wherein the function performing step comprises performing the focusing control operation, exposure control operation and object following operation for focusing on the predetermined object, based on the light from the object having the fourth transmitting wavelength band selected at the fourth selecting step.

19. An image pick-up apparatus for shooting an object, comprising:
- a recording unit for recording data;
- a filter having a transmitting wavelength band for transmitting a light from the object, having the transmitting wavelength band;
- a spectral control unit for inputting a drive signal to the filter to change the transmitting wavelength band of the filter in plural steps;
- a single image pick-up unit disposed at a rear side of the filter, for generating image data every time when the transmitting wavelength band of the filter is changed by the spectral control unit; and
- a record control unit for recording in the recording unit plural pieces of image data generated by the single image pick-up unit;

wherein the spectral control unit comprises:
- a temperature detecting unit for detecting a temperature; and
- a correction unit for correcting a current driving amount and a current driving direction based on the temperature detected by the temperature measurement unit.

20. A method of controlling an image pick-up apparatus for shooting an object, the apparatus including a recording unit for recording data, a filter having a transmitting wavelength band for transmitting a light from the object, having the transmitting wavelength band, wherein the transmitting wavelength band is changed based on an input drive signal, and wherein the apparatus further includes a single image pick-up unit disposed at a rear side of the filter, for generating image data every time when the transmitting wavelength band of the filter is changed, and a temperature detecting unit for detecting a temperature, the method comprising:
- inputting the drive signal to the filter, thereby changing the transmitting wavelength band of the filter in plural steps;
- making the single image pick-up unit operate to generate image data every time when the transmitting wavelength band of the filter is changed; and
- recording in the recording unit plural pieces of image data generated by the single image pick-up unit;
- wherein a current driving amount and a current driving direction are corrected based on the temperature detected by the temperature measurement unit.

* * * * *